(12) United States Patent
    Hashimoto

(10) Patent No.: US 9,276,136 B2
(45) Date of Patent: Mar. 1, 2016

(54) DYNAMIC QUANTITY SENSOR

(71) Applicant: Dai Nippon Printing Co., Ltd., Tokyo (JP)

(72) Inventor: Katsumi Hashimoto, Tokyo (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 125 days.

(21) Appl. No.: 13/724,586

(22) Filed: Dec. 21, 2012

(65) Prior Publication Data

US 2013/0113056 A1    May 9, 2013

Related U.S. Application Data

(63) Continuation of application No. PCT/JP2011/064134, filed on Jun. 21, 2011.

(30) Foreign Application Priority Data

Jun. 21, 2010    (JP) .................................. 2010-140317

(51) Int. Cl.
    *H01L 29/84*     (2006.01)
    *B81B 7/00*      (2006.01)
    *G01P 15/08*     (2006.01)
    *G01P 15/12*     (2006.01)

(52) U.S. Cl.
    CPC .............. *H01L 29/84* (2013.01); *B81B 7/0054* (2013.01); *G01P 15/0802* (2013.01); *G01P 15/123* (2013.01); *B81B 2201/0235* (2013.01); *B81C 2203/0154* (2013.01); *G01P 2015/0842* (2013.01)

(58) Field of Classification Search
    USPC ........ 73/504.12, 514.33, 514.38, 514.36, 493
    See application file for complete search history.

(56) References Cited

U.S. PATENT DOCUMENTS

| 5,610,334 A | * | 3/1997 | Fima et al. ................. 73/504.12 |
| 2003/0209075 A1 | | 11/2003 | Okada |
| 2006/0086186 A1 | * | 4/2006 | Ichikawa .................... 73/514.36 |

(Continued)

FOREIGN PATENT DOCUMENTS

| CN | 101587131 A | 11/2009 |
| JP | 11337571 A | 12/1990 |

(Continued)

OTHER PUBLICATIONS

Jp6291334_english translation (see attachment).*

(Continued)

*Primary Examiner* — Hezron E Williams
*Assistant Examiner* — Xin Zhong
(74) *Attorney, Agent, or Firm* — Pearne & Gordon LLP

(57) ABSTRACT

The present invention provides a dynamic quantity device which reduces stress received by a sensor due to resin packaging and reduces variation in sensor characteristics due to stress. The dynamic quantity sensor includes a semiconductor substrate including a fixing part and a flexible part and a movable part positioned on an interior side of the fixing part, and a cap component configured to cover the flexible part and the movable part, wherein the fixing part includes an interior frame configured to enclose the flexible part and the movable part and an exterior part positioned on a periphery of the interior frame, a slit configured to divide the interior frame and the exterior frame, and a linking part configured to link the interior frame and the exterior frame.

9 Claims, 48 Drawing Sheets

(56) References Cited

U.S. PATENT DOCUMENTS

| | | |
|---|---|---|
| 2008/0196502 A1 | 8/2008 | Fukuda |
| 2009/0282918 A1 | 11/2009 | Maekawa |
| 2010/0005886 A1* | 1/2010 | Aida et al. ............. 73/514.34 |
| 2010/0218607 A1* | 9/2010 | Kazama et al. ......... 73/514.33 |
| 2010/0300205 A1* | 12/2010 | Kazama et al. ......... 73/514.33 |
| 2012/0096942 A1* | 4/2012 | Hayashi et al. ......... 73/504.12 |

FOREIGN PATENT DOCUMENTS

| | | | |
|---|---|---|---|
| JP | 6291334 A | | 10/1994 |
| JP | 06291334 A | * | 10/1994 |
| JP | 2000046862 A | | 2/2000 |
| JP | 2003-329702 A | | 11/2003 |
| JP | 2005337874 A | | 12/2005 |
| JP | 2006300904 A | | 11/2006 |
| JP | 2008-008820 A | | 1/2008 |
| JP | 2009053179 A | | 3/2009 |
| JP | 2009053180 A | | 3/2009 |

OTHER PUBLICATIONS

JP_06291334 english translation.*
International Search Report for PCT/JP2011/064134; Jun. 21, 2011.
Partial English Translation of Japanese Unexamined Patent Application Publication No. 2005-337874.
Partial English Translation of Japanese Unexamined Patent Application Publication No. H6-291334.
Chinese Office action for Application No. 201180030962.6 dated Nov. 5, 2013.
Written Opinion of the International Searching Authority for International Application No. PCT/JP2011/064134 dated Sep. 27, 2011.
Office Action issued in Chinese Patent Application No. 2011800309626 dated Jan. 21, 2015.
Office Action issued in Japanese Patent Application No. 2012-521473 dated Feb. 10, 2015.
Office Action issued in corresponding Chinese Patent Application No. 2011800309626 dated Sep. 2, 2014.
Decision to Grant a Patent in corresponding Japanese Patent Application No. 2012-521473 dated Sep. 15, 2015.

* cited by examiner (A) Condition A (B) Condition B

Condition A
Structure Type A

Condition A
Structure Type B

Condition A
Structure Type C

Condition A
Structure Type D

Condition A
Structure Type E

Condition A
Structure Type F

Condition A
Structure Type G

Condition A
Structure Type H

FIG.14

| | | Stress Relief Part | |
|---|---|---|---|
| | | Not Present | Present |
| Linking part length LR | 660[um] | ○ (Type A) | ○ (Type B) |
| | 340[um] | ○ (Type E) | ○ (Type F) |
| | 270[um] | ○ (Type C) | ◎ (Type D) |
| | 140[um] | ◎ (Type G) | ◎ (Type H) |

→ Stress relief part has effects

→ Stress relief part has effects

→ Stress relief part has effects

→ Stress relief part has almost no effects

FIG.16

|  |  | Stress Relief Part ||
|---|---|---|---|
|  |  | Not Present | Present |
| Linking part length LR | 660[um] | ○ Type A) | ○ (Type B) | → Stress relief part has effects
| | 340[um] | ○ (Type E) | ○ (Type F) | → Stress relief part has effects
| | 270[um] | ○ (Type C) | ◎ (Type D) | → Stress relief part has effects
| | 140[um] | ◎ (Type G) | ◎ (Type H) | → Stress relief part has effects Structure type A1

Structure type B1

Structure type C1

Structure type D1

Structure type E1

Structure type F1

Structure type G1

Structure type H1

Structure type I1

Structure type J1

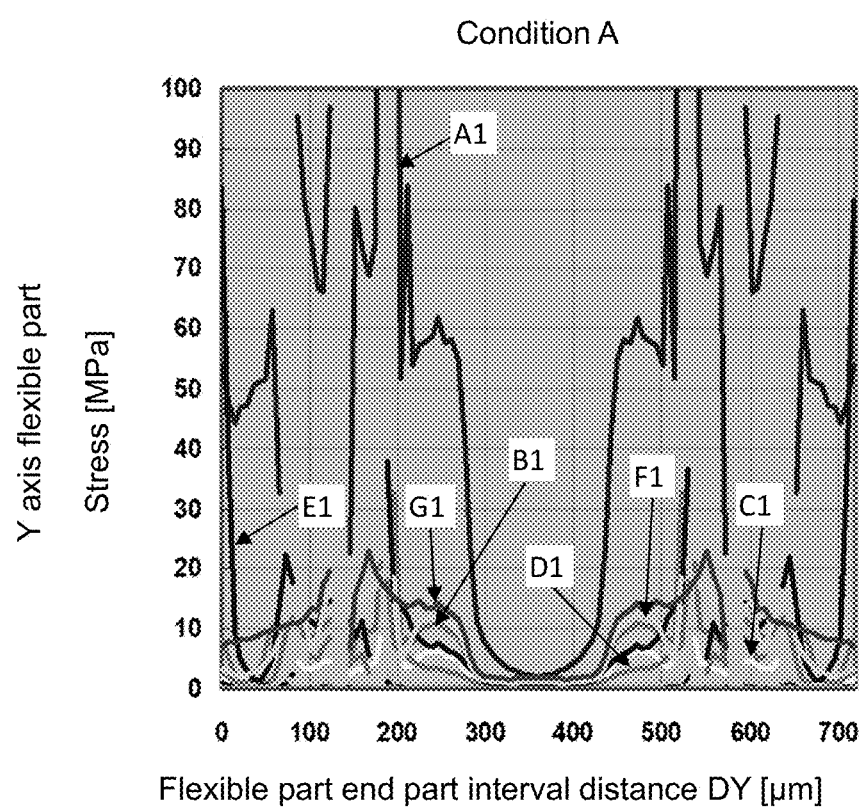

DYNAMIC QUANTITY SENSOR

CROSS-REFERENCE TO RELATED APPLICATIONS

This application is a U.S. continuation application filed under 35 USC 111(a) claiming benefit under 35 USC 120 and 365(c) of PCT application JP2011/064134, filed on Jun. 21, 2011, and the benefit of priority from the prior Japanese Patent Application No. 2010-140317, filed on Jun. 21, 2010: the entire contents of which are incorporated herein by reference.

FIELD

The present invention is related to a dynamic quantity sensor including a movable part which moves by an external force.

BACKGROUND

In recent years, small-scale light electronic devices with multi-functionality and high functionality are becoming widespread and a greater level of integration of installed electronic components is being demanded. In response to such demands, the number of each type of electronic component being manufactured as a semiconductor device is increasing. In addition, a wide variety of sensors are being manufactured as small-scale semiconductor devices apart from semiconductor devices manufactured as circuit components. For example, a dynamic quantity sensor having a small-scale simple structure is realized using MEMS (Micro Electro Mechanical Systems) technology. As a dynamic quantity sensor (known as a piezo resistor type sensor) for example, a moving part which displaces according an external force is formed using a semiconductor substrate and a dynamic quantity sensor which detects the displacement of this moving part using a piezo resistor element is realized in an acceleration sensor or angular velocity sensor.

In the dynamic quantity sensor described above, various packages are used in order to stabilize and displace a movable part of the sensor. For example, the semiconductor substrate formed with a sensor is covered with a cap component and a resin package for sealing the cap component is used with a resin mold etc. In addition, a ceramic package is used to house and seal the semiconductor substrate formed with the sensor.

However, there was a problem in the case where a resin package is used whereby a sensor receives stress in the packaging process due to a difference in a linear expansion coefficient between a semiconductor substrate formed with the sensor and a resin mold, and sensor characteristics such as an offset voltage or sensitivity etc vary after the sensor is packaged. After the sensor is packaged the stress received during the packaging process remains and the stress received by the sensor changes due to a change in temperature added within a sensor specifications range. Because the amount by which the resin expands is large compared the amount of expansion of the semiconductor substrate when the added temperature reaches a high level, the stress received by the sensor is relaxed. However, because the amount by which the resin contracts is large compared the amount of contraction of the semiconductor substrate when the added temperature is a low level, the stress received by the sensor increases. Furthermore, in case of ceramic packaging, because the difference in a linear expansion coefficient between a semiconductor substrate and a ceramic is small and the ceramic itself has a high level of rigidity, the amount of change in stress received by the sensor due to a change in temperature is small and the effects on the sensor's characteristics is slight. However, since the costs of ceramic packaging are high compared to resin packaging, the manufacturing costs of the dynamic quantity sensor increase.

For example, an acceleration sensor described in Japanese Laid Open Patent 2006-300904, Japanese Laid Open Patent 2005-337874, Japanese Laid Open Patent 2000-46862 and Japanese Laid Open Patent 2009-53180, and an inertial sensor described in Japanese Laid Open Patent H11-1337571 are proposed as a structure for relaxing the stress received by a sensor during the packaging process described above. A slit is formed to pass through the sensor including a cap component in the acceleration sensor in Japanese Laid Open Patent 2006-300904. In the acceleration sensor in Japanese Laid Open Patent 2005-337874, an internal frame formed with the sensor and an external frame which encloses the external periphery of the internal frame are joined together by a stress relaxation beam. In the acceleration sensor in Japanese Laid Open Patent 2000-46862, a curved part is arranged on a distorted part which swingably supports a spindle which becomes a movable part. In the sensor in Japanese Laid Open Patent 2009-53180, a stress buffer is arranged on at least one part of a beam. In addition, in the inertia sensor in Japanese Laid Open Patent H11-337571, a slit for reducing thermal stress is arranged on the external periphery edge of a diaphragm.

However, the acceleration sensors described in Japanese Laid Open Patent 2006-300904, Japanese Laid Open Patent 2005-337874, Japanese Laid Open Patent 2000-46862 and Japanese Laid Open Patent 2009-53180, and the inertial sensor described in Japanese Laid Open Patent H11-1337571 have the following problems.

In the acceleration sensor in Japanese Laid Open Patent 2006-300904, because a slit which passes through the sensor including a cap component is formed the sensor does not have a structure for relaxing stress. In addition, the acceleration sensor in Japanese Laid Open Patent 2006-300904 does not consider using resin packaging. That is, in the case where resin packaging is used in the acceleration sensor in Japanese Laid Open Patent 2006-300904, stress received by the sensor in the resin packaging process can't be reduced because resin enters the slit part. In the acceleration sensor in Japanese Laid Open Patent 2005-337874, although an internal frame formed with the sensor and an external frame which encloses the external periphery of the internal frame are joined together by a stress relaxation beam, because the length of the stress relaxation beam is longer than the length of one edge of the sensor, when the resonance frequency of the sensor due to an external force is considered, in order to realize a stress relaxation beam of a sufficiently higher resonance frequency than the resonance frequency of the sensor it is necessary to increase the width of the stress relaxation beam. Because the level of design freedom of a wiring layout is reduced when the width of the stress relaxation beam is increased, the area of the semiconductor substrate formed with the sensor and stress relaxation beam is increased, which acts counter to the demands for small scale. In any of the structures of the acceleration sensors in Japanese Laid Open Patent 2000-46862 and Japanese Laid Open Patent 2009-53180 and the inertia sensor in Japanese Laid Open Patent H11-33751 it is difficult to maintain the sensor's characteristics in the case where stress is received from resin packaging, in particular, it is difficult to reduce changes in temperature characteristics along a Z axis in the case where stress from resin packaging is received.

The present invention attempts to solve the problems described above and aims to provide a dynamic quantity sensor which reduces stress received by the sensor due to resin packaging and controls variation in sensor characteristics due to stress.

SUMMARY

A dynamic quantity sensor related to one embodiment of the present invention includes a semiconductor substrate including a fixing part and a flexible part and a movable part positioned on an interior side of the fixing part; and a cap component configured to cover the fixing part and the movable part, wherein the fixing part includes an interior frame configured to enclose the flexible part and the movable part and an exterior part positioned on a periphery of the interior frame, a slit configured to divide the interior frame and the exterior frame, and a linking part configured to link the interior frame and the exterior frame. According to the dynamic quantity, sensor stress received by a sensor during a packaging process can be reduced and variation in sensor characteristics due to stress can be reduced.

In addition, in the dynamic quantity sensor related to one embodiment of the present invention, the slit may have a shape including at least one open part configured to divide the interior frame and the exterior frame except the linking part. According to the dynamic quantity sensor, the effects affected by stress applied during a packaging process on the sensor can be reduced.

In addition, in the dynamic quantity sensor related to one embodiment of the present invention, the slit may include a plurality of line shaped slits between the interior frame and the exterior frame. According to the dynamic quantity sensor, the effects affected by stress applied during a packaging process on the sensor can be reduced.

In addition, in the dynamic quantity sensor related to one embodiment of the present invention, a length of the linking part is preferred to be shorter than a length of the slit. According to the dynamic quantity sensor, the effects affected by stress applied during a packaging process on the sensor can be further reduced.

In addition, in the dynamic quantity sensor related to one embodiment of the present invention, the linking part may link one part of the interior frame and one part of the exterior frame at one section. According to the dynamic quantity sensor, the effects affected by stress applied during a packaging process on the sensor can be further reduced.

In addition, in the dynamic quantity sensor related to one embodiment of the present invention, the linking part may link the interior frame and the exterior frame at a position facing the flexible part. According to the dynamic quantity sensor, the effects affected by stress applied during a packaging process on the sensor can be further reduced.

In addition, in the dynamic quantity sensor related to one embodiment of the present invention, the linking part may link the interior frame and the exterior frame at a position away from a position facing the flexible apart. According to the dynamic quantity sensor, the effects affected by stress applied during a packaging process on the sensor can be further reduced.

In addition, in the dynamic quantity sensor related to one embodiment of the present invention, the flexible part may include a stress relief part. The stress relief part can include at least one ring shape, and the flexible part can be arranged line symmetrical along a length direction of the flexible part. According to the dynamic quantity sensor, the effects affected by stress applied during a packaging process on the sensor can be further reduced.

In addition, the dynamic quantity sensor related to one embodiment of the present invention may further include a substrate configured to carry the semiconductor substrate. The semiconductor substrate may include a bump electrically connected to the substrate. According to the dynamic quantity sensor, the effects affected by stress applied during a packaging process on the sensor can be further reduced.

According to the present invention, by arranging a slit which divides an interior frame and exterior frame on a semiconductor substrate it is possible to reduce stress received by a sensor during resin packaging and provide a dynamic quantity sensor which reduces variation in sensor characteristics due to stress.

BRIEF DESCRIPTION OF THE DRAWINGS

FIG. 14 is a chart which of the calculated measurement results in FIG. 13A and FIG. 13B;

FIG. 16 is a chart which of the calculated measurement results in FIG. 15A and FIG. 15B;

FIG. 22B is a graph showing the results of measuring the size of stress received by a flexible part in a Y axis direction of a sensor when stress is applied under condition A to each structure of type A1~J1 related to example 3;

DESCRIPTION OF EMBODIMENTS

The embodiments of the present invention are explained in detail below while referring to the diagrams. Furthermore, although the embodiments below are explained using an external frame which has an approximately square shaped exterior periphery, an internal frame and a spindle, the present invention should not be limited to the illustrative examples. That is, as long as the shape of the external frame, internal frame and spindle includes line symmetry, a regular polygon other than a square, a circle or elliptical shape may also be used.

First Embodiment

In the first embodiment of the present invention, an example of an acceleration sensor is explained as a dynamic quantity sensor while referring to the diagrams.
(Structure of an Acceleration Sensor)

Figure 1:
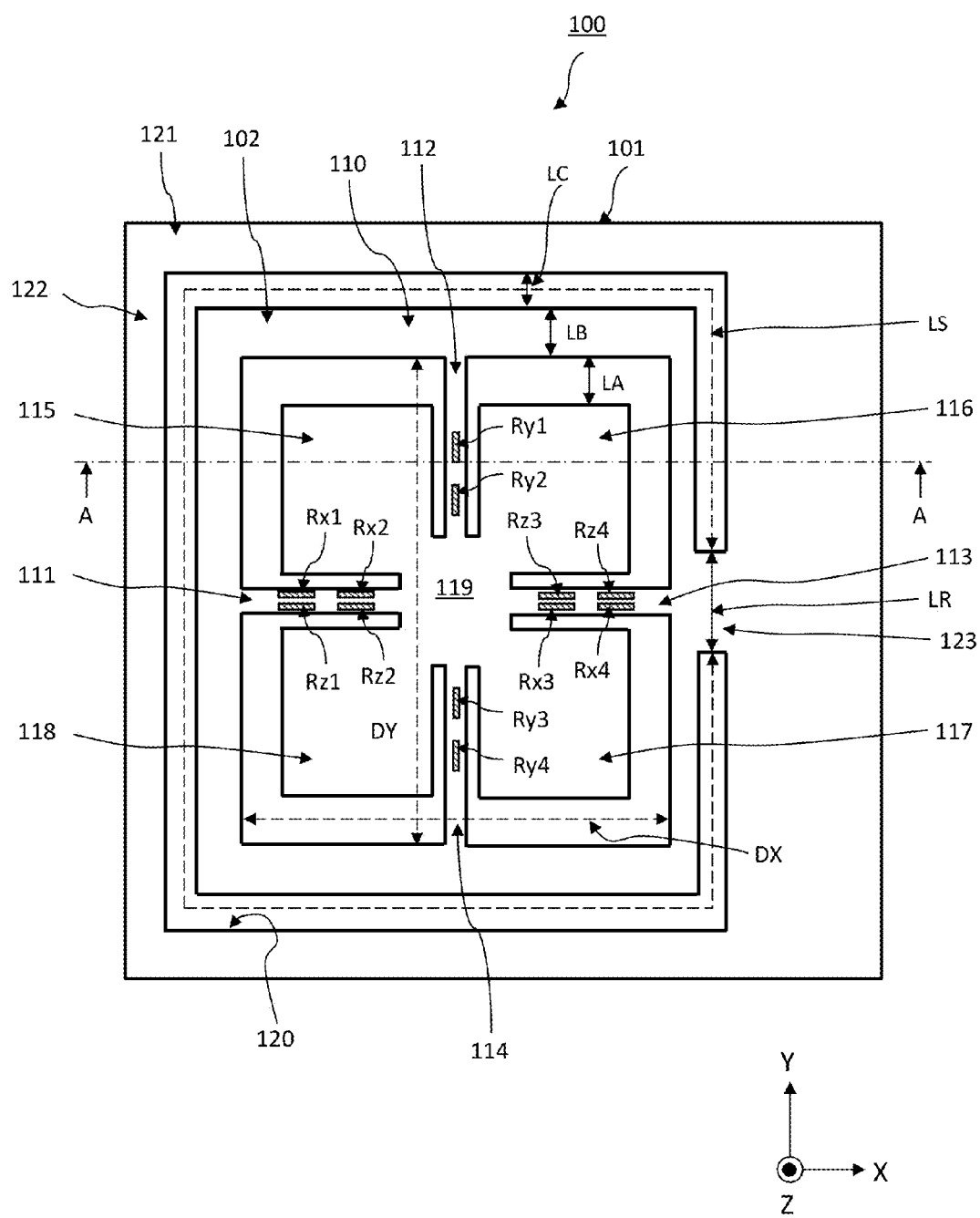
FIG. 1 is a planar view diagram showing the entire structure of an acceleration sensor related to a first embodiment of the present invention.
Figure 2A:
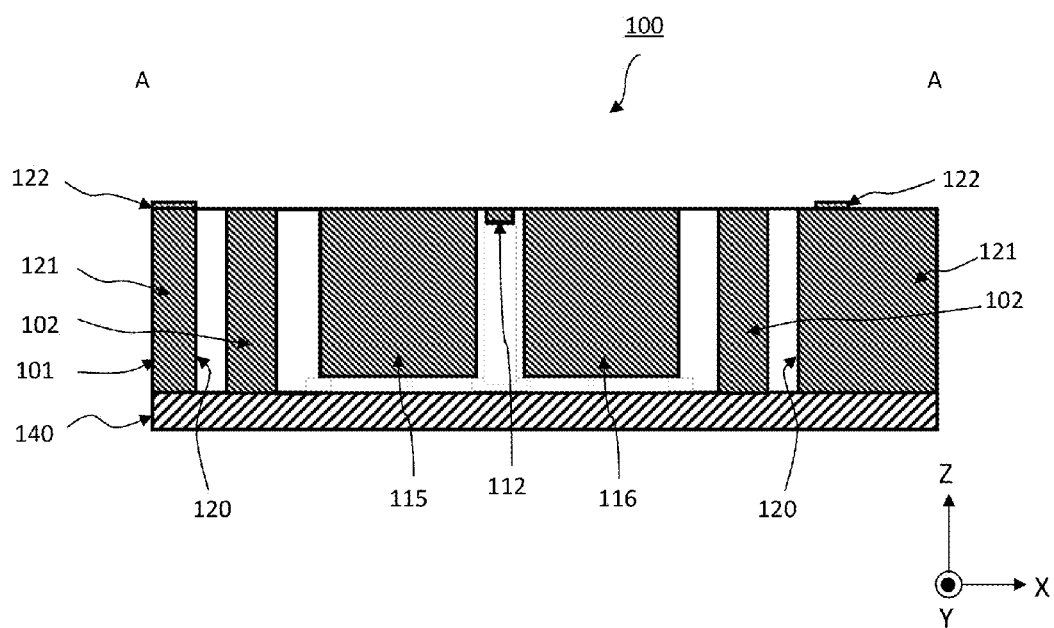
FIG. 2A is a cross-sectional view diagram of the acceleration sensor seen from the line A-A in FIG. 1.
Figure 2B:
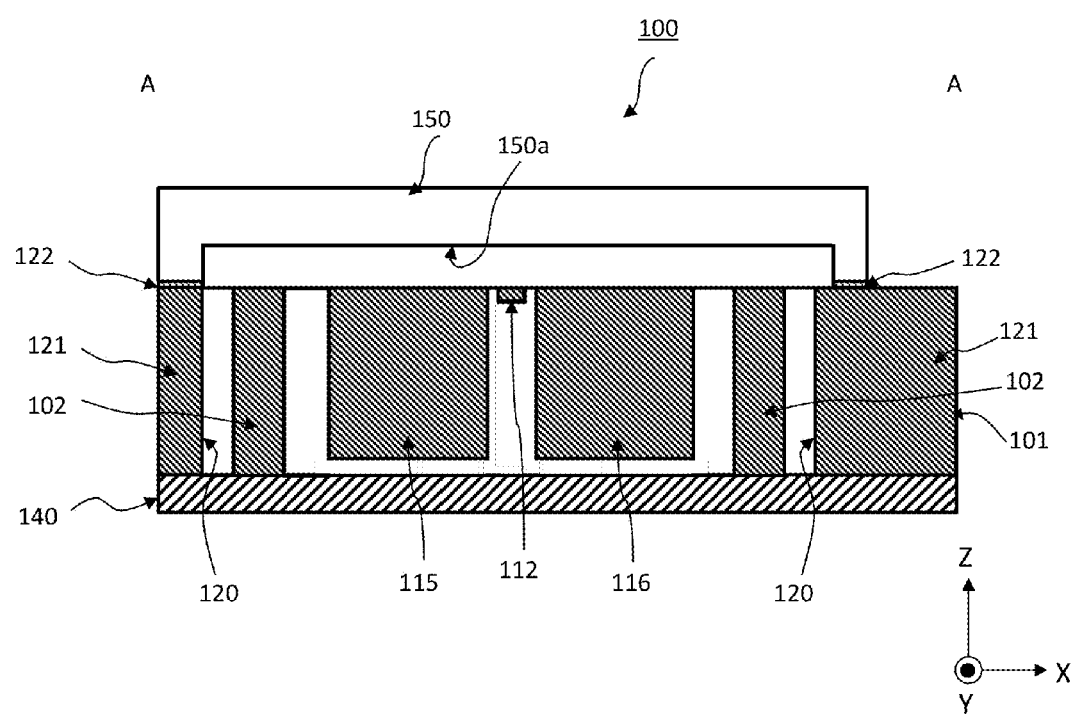
FIG. 2B is a cross-sectional view diagram showing a structure whereby an upper part cap component is joined to the acceleration sensor in FIG. 2A.
Figure 3:
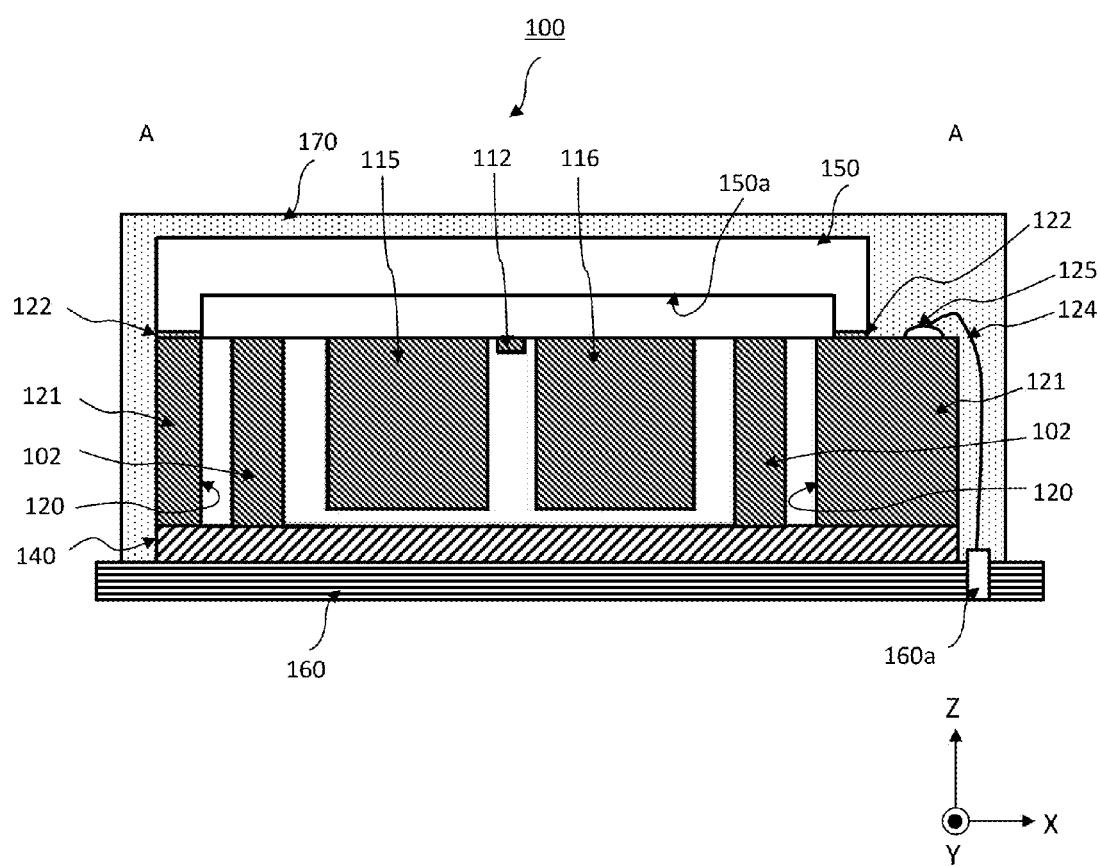
FIG. 3 is a cross-sectional view diagram showing a structure whereby the acceleration sensor in FIG. 2B is sealed with a mold resin.

First, the structure of an acceleration sensor related to the first embodiment is explained while referring to FIG. 1~FIG. 3.

FIG. 1 is a planar view diagram which shows the entire structure of an acceleration sensor 100. FIG. 2A, FIG. 2B and FIG. 3 are cross-sectional diagrams seen from the line A-A of the acceleration sensor 100. In FIG. 1, a semiconductor substrate 101 includes a fixing part 110 and flexible parts 111~114 and movable parts (including flexible parts 111~114 and a spindles 115~118) which are located on the interior side of the fixing part 110. Specifically, 119 is a spindle joining part which joins the spindles 115~118 which form the movable part, the flexible parts 111~114 support the spindle joining part 119 to be capable of displacement and the fixing part 110 supports the flexible parts 111~114 at the exterior periphery section of the flexible parts 111~114. 120 is a slit formed to pass through the semiconductor substrate 101 (see FIG. 2A and FIG. 2B). Slit 120 divides the fixing part 110 between an interior frame 102 which enclose the flexible parts 111~114 and the spindles 115~118, and an exterior frame 121 which is located on the periphery of the interior frame 102. A joining part 122 is formed on the periphery of the exterior frame 121 for joining an upper cap component described below. The interior frame 102 and the exterior frame 121 are linked by a linking part 123. Slit 120 is formed in a roughly C except the linking part 123. The linking part 123 links a part of the interior frame 102 and a part of the exterior frame 121 at one section located opposite the flexible part 113. In addition, the length LR of the linking part 123 shown in FIG. 1 is shorter than the length LS of the slit 120 shown in FIG. 1. Furthermore, in FIG. 1, LA indicates the width of a gap between the fixing part 110 and the spindles 115~118, LB indicates the width of the fixing part 110 and LC indicates the width of the slit 120. It is desirable that these widths LA and LC are roughly the same width in order to make the etching conditions uniform and simplify the etching process when the sensor and slit 120 are formed by etching in the manufacturing process described below. For example, the widths LA and LC may be within the range of |LA−LC| is 50 [μm] (or more preferably 30 [μm]). In addition, while the case is shown in FIG. 1 whereby the linking part 123 is formed in a roughly C shape (a shape in which at least one part is open) so that the interior frame 102 and the exterior frame 121 are linked at the section on the right hand side in the diagram, the shape of the linking part 123 is not limited to this shape. For example, in the second and third embodiments described below the formation positions and length LR may be modified in various ways and the interior frame 102 and the exterior frame 121 may be linked at a plurality of sections. That is, the linking part 123 is for linking the interior frame 102 and exterior framer 121 and its shape and size and number of linking sections are not limited.

Twelve piezo resistor elements Rx1~Rx4, Ry1~Ry4, Rz1~Rz4 are formed, which detect the displacement of a movable part in an X (horizontal direction in FIG. 1), Y (vertical direction in FIG. 1), and Z (depth vertical with respect to the page in FIG. 1) tri-axial direction at four sections on the flexible parts 111~114. In the present embodiment, the piezo resistor elements Rx1~Rx4 detect the X axis direction, the piezo resistor elements Ry1~Ry4 detect the Y axis direction, and the piezo resistor elements Rz1~Rz4 detect the Z axis direction respectively. However each axial direction which is set to the piezo resistor elements Rx1~Rx4, Ry1~Ry4 and Rz1~Rz4 are not limited.

The piezo resistor elements Rx1~Rx4, Ry1~Ry4, Rz1~Rz4 are connected using a plurality of metal wires (not shown in the diagram) to form a bridge circuit. In the acceleration sensor 100 related to the present embodiment, the flexible parts 111~114 are displaced when the spindles 115~118 are displaced in response to an external force and the resistance value of each piezo resistor element Rx1~Rx4, Ry1~Ry4, Rz1~Rz4 arranged on each flexible part 111~114 changes according to the displacement direction. The change in this resistance values are detected by the bridge circuit and an acceleration detection signal is output. The acceleration detection signal is externally output via a through electrode 160a (see FIG. 3) of substrate 160 described below (see FIG. 3) via bonding wire 124 (see FIG. 3) which is connected to an electrode part 125 (see FIG. 3) formed on the upper surface of the semiconductor substrate 101.

Next, a cross-sectional view of the acceleration sensor 100 seen from the line A-A in FIG. 1 is shown in FIG. 2A and FIG. 2B. FIG. 2A is a cross-sectional view of the acceleration sensor 100 seen from the line A-A in FIG. 1, and FIG. 2B is a cross-sectional view which shows the state whereby an upper part cap component 150 is joined to the upper surface of the semiconductor substrate 101 in FIG. 2A. In FIG. 2A and FIG. 2B, the same reference symbols are attached to the same structural components as those shown in FIG. 1. In FIG. 2A, the slit 120 is formed to pass through the semiconductor substrate 101. 140 is a lower part cap component joined to the lower surface side of the semiconductor substrate 101. In FIG. 2B, 150 is an upper part cap component. The upper part cap component 150 is joined to a joining part 122 on the upper surface of the semiconductor substrate 101. A recessed portion 150a is formed on a surface facing the flexible parts 111~114 and spindles 115~118 and the upper part cap component 150 is formed so as to not contact the flexible parts 111~114 and spindles 115~118 when they displace. In addition, the spindles 115~118 hit the upper part cap component 150 in the case where the flexible parts 111~114 and spindles 115~118 excessively displace, and the upper part cap component 150 acts to limit this displacement. In addition, the upper part cap component 150 is arranged in order to prevent foreign objects from being attached to movable parts (including the flexible parts 111~114 and spindles 115~118) during manufacture of the acceleration sensor 100 by covering and sealing the upper side of the flexible parts 111~114 and spindles 115~118, prevent a mold resin which covers the entire sensor from obstructing the operation of the movable parts and prevent the flexible parts 111~114 from damage due to excessive displacement of the spindles 115~118.

FIG. 3 is a cross-sectional diagram seen from the line A-A of the acceleration sensor 100 in FIG. 1. In FIG. 3, the same reference symbols are attached to the same structural components as those shown in FIG. 1. In FIG. 1, 160 is a substrate formed with a plurality of through electrodes 160a and 170 is a mold resin. The substrate 160 carries the semiconductor substrate 101 which joins the lower part cap component 140 and upper part cap component 150. The lower part cap component 140 is adhered to the upper surface of the substrate 160 by an adhesive etc, and the through electrode 160a of the substrate 160 is electrically connected with the electrode pad 125 formed on the upper surface of the semiconductor substrate 101 by bonding wire 124. After the bonding wire 124 is connected, the semiconductor substrate 101 and the lower part cap component 140 are covered by the mold resin 170 and the resin package type acceleration sensor 100 is formed.

(Structure for Reducing the Effects of Stress in a Resin Packaging Process)

As described above, In a resin packaging process using the mold resin 170, the fixing part 110, flexible parts 111~114 and spindles 15~118 receive stress due to a difference in a linear expansion coefficient between the semiconductor substrate 101 and resin mold 170, and sensor characteristics such as an offset voltage or sensitivity etc vary after the sensor is resin packaged. The inventors of the present invention found through the example described below that the shape of the slit 120 shown in FIG. 1 and the length LR (see FIG. 1) of the linking part 123 which links the interior frame 102 and exterior frame 121 are related to the composing elements reducing the effects of stress during a resin packaging process. Based on this knowledge, in the examples described below, the stress which is generated in the acceleration sensor 100 by changing the shape of the slit 120 and the length of the linking part 123 was measured. As a result, the specifics of the structure which reduces the effects of stress in the acceleration sensor 100 related to the first embodiment are described in the examples below.

Second Embodiment

In the second of the present invention an example of an acceleration sensor is explained as a dynamic quantity sensor while referring to the diagrams. The acceleration sensor of the second embodiment is arranged with a stress relief part on a flexible part of the sensor.

(Structure of an Acceleration Sensor)

Figure 4:
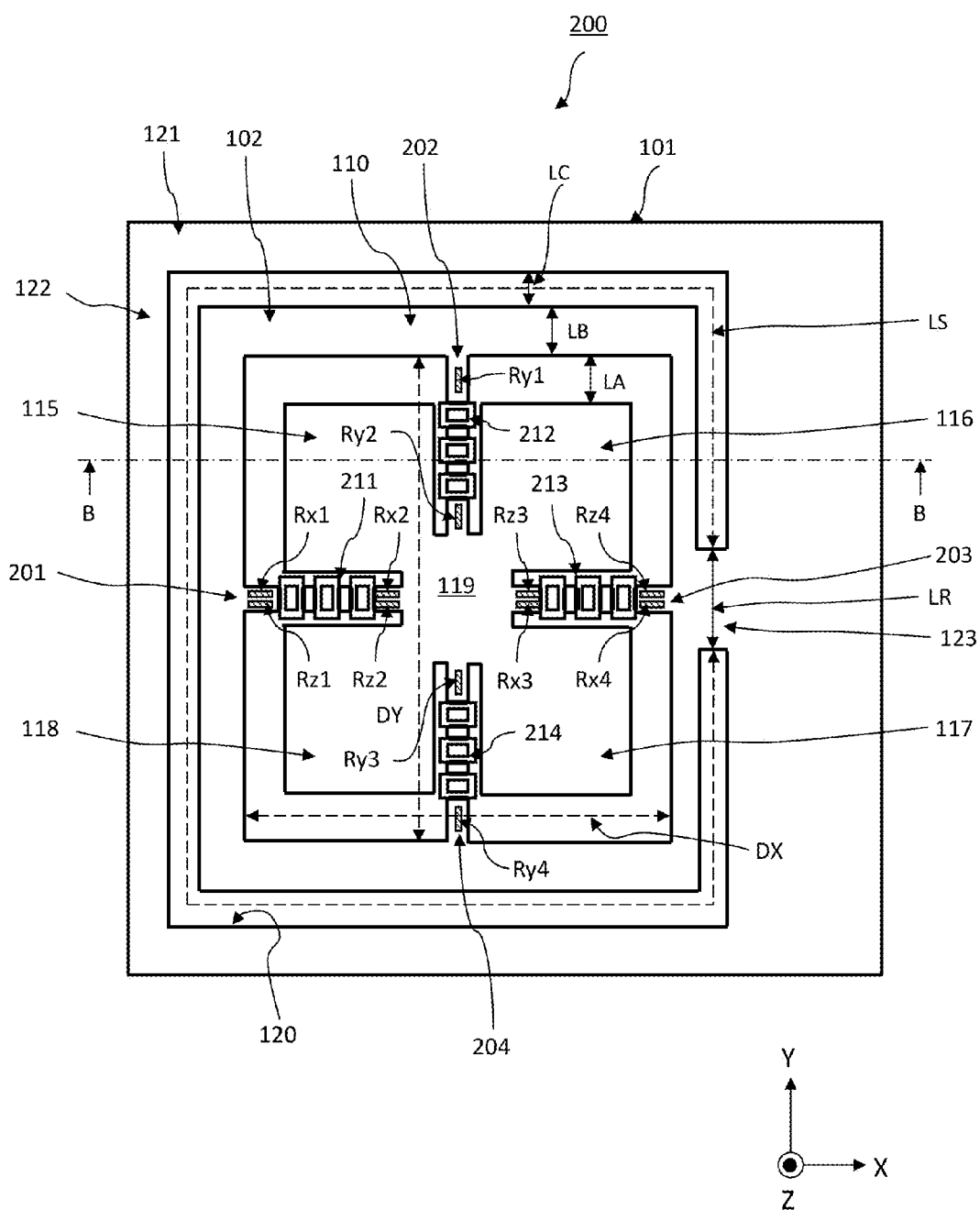
FIG. 4 is a planar view diagram showing the entire structure of an acceleration sensor related to a second embodiment of the present invention.

First, the structure of an acceleration sensor related to the second embodiment is explained while referring to FIG. 4.

FIG. 4 is a planar view diagram which shows the entire structure of an acceleration sensor 200. Furthermore, in FIG. 4, the same reference symbols are attached to the same structural components as those in the acceleration sensor 100 shown in FIG. 1, FIG. 2A, FIG. 2B and FIG. 3 and an explanation of these structural components is omitted. In addition, because a cross-sectional structure of the acceleration sensor 200 related to the second embodiment is the same the cross-sectional structure of the acceleration sensor 100 shown in FIG. 3, illustrations and structural explanations are omitted.

In FIG. 4, 101 is a semiconductor substrate, 119 is a spindle joining part which joins spindles 115~118 which form a movable part, and 201~204 are flexible parts which support the spindle joining part 119 to be capable of displacement. The flexible parts 201~204 include stress relief parts 211~214 for relieving the effects of stress on the fixing part 110, the flexible parts 111~114 and spindles 115~118. The stress relief parts 211~214 are arranged to reduce the effects of stress on the sensor during a resin packaging process and also to make any left or right transformation of the flexible parts 201~204 symmetrical. The stress relief parts 211~214 each include three donut shaped structure as shown in FIG. 4. Apart from stress relief parts 211~214 on the flexible parts 201~204, twelve piezo resistor elements Rx1~Rx4, Ry1~Ry4, Rz1~Rz4 which detect the displacement of a movable part in an X (horizontal direction in FIG. 4), Y (vertical direction in FIG. 4), and Z (depth vertical with respect to the page in FIG. 4) tri-axial direction are formed at the eight sections It is desirable that the stress relief parts 211~214 are arranged at a roughly center position in a length direction of each of the flexible part 201~204. By arranging the stress relief parts 211~214 at a roughly center position of each of the flexible parts 201~204 it is possible to effectively reduce the effects of stress on the fixing part 110, flexible parts 111~114 and spindles 115~118. In addition, by arranging the stress relief parts 211~214 at a roughly center position of each of the flexible parts 201~204, left or right transformations which sandwich the stress relief parts 211~214 of each of the flexible parts 201~204 become symmetrical when the flexible parts 201~204 transform due to stress received by the semiconductor substrate 101 during the resin packaging process. As a result, it becomes easier to make changes due to stress in the piezo resistor elements Rx1~Rx4, Ry1~Ry4, Rz1~Rz4 formed on each of the flexible parts 201~204 more uniform and changes in the resistance value of each of the piezo resistor elements Rx1~Rx4, Ry1~Ry4, Rz1~Rz4 also become uniform. Furthermore, although the stress relief parts 211~214 shown in FIG. 4 each include three donut shapes structures the shape and number are not limited to this. Any shape and number are possible as long as changes in resistance values due to stress on the piezo resistor elements Rx1~Rx4, Ry1~Ry4, Rz1~Rz4 are made uniform. The stress relief parts 211~214 are not limited to the donut shape described above. Any shape is possible as long as the shape can flexibly transform so that stress generated in the flexible parts is relieved. For example, a shape including rotation symmetry or mirror image symmetry such as a line symmetric circular body, a zig zag shape or curved shape can be exemplified. In the present invention, it is preferred that the stress relief part be formed line symmetrical using at least one part having a line symmetric shape.

(Structure for Reducing the Effects of Stress in a Resin Packaging Process)

The acceleration sensor 200 is arranged with the slit 120 and linking part 123 based on the knowledge described above and is further arranged with stress relief parts 211~214 for reducing changes in the resistance value of the piezo resistors due to stress. In the examples described below, in addition to changing the shape of the slit 120 and the length LR of the linking part 123, the stress generated in the acceleration sensor 200 in the case where stress relief parts 211~214 are combined was measured. As a result, the specifics of the structure which reduces the effects of stress in the acceleration sensor 200 related to the second embodiment are described in the examples below.

Third Embodiment

In the third embodiment of the present invention an example of an acceleration sensor is explained as a dynamic quantity sensor while referring to the diagrams. In the acceleration sensor of the third embodiment, a fixing part 110, flexible parts 111~114 and spindles 115~118 are mounted in the substrate 160 using flip chip mounting technology. Furthermore, the structure of the flip chip mounting related to the third embodiment can also be applied to the acceleration sensor 100 and 200 shown in the first and second embodiments described above. As a result, the structure of the acceleration sensor related to the third embodiment is explained using only the cross-sectional view shown in FIG. 5 and the planar view is omitted. While a flip chip connection is given as a more preferable form of an electrical connection between a sensor and a substrate, the sensor and substrate may also be connected by wire bonding etc. Therefore, the sensor and substrate can be electrically connected using various types of wiring components.

Figure 5:
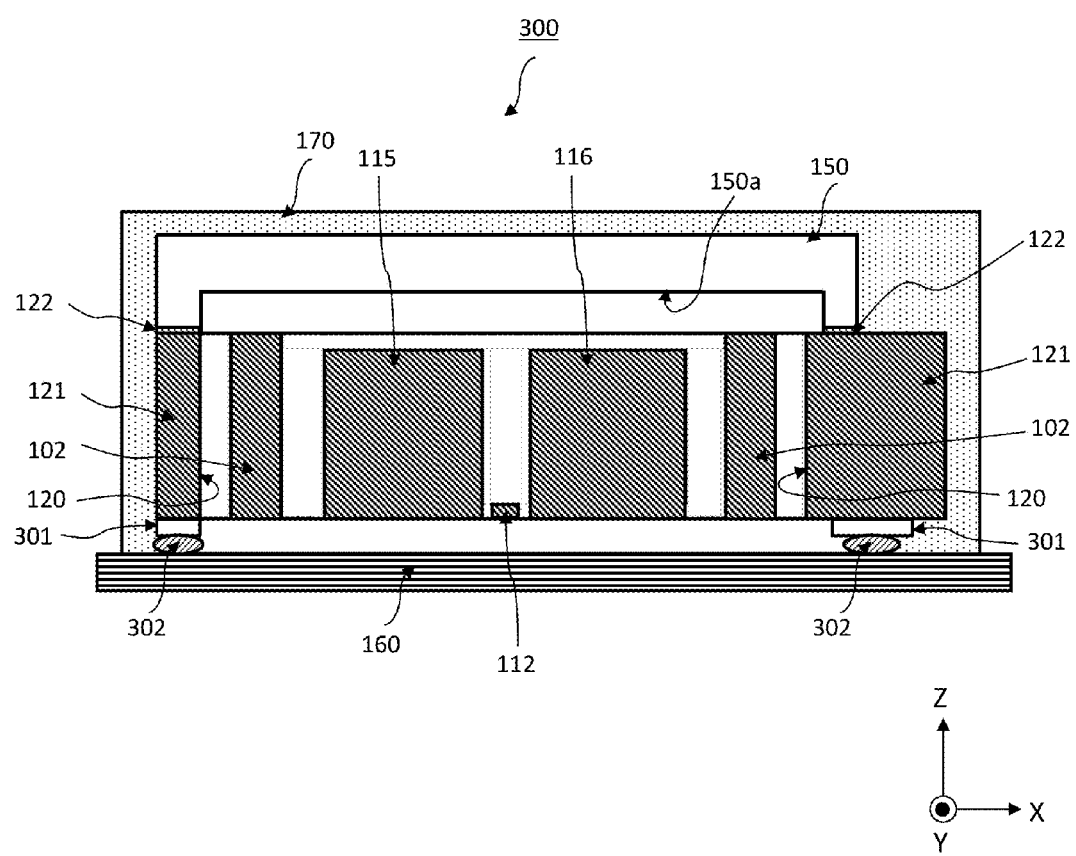
FIG. 5 is a planar view diagram showing the entire structure of an acceleration sensor related to a third embodiment of the present invention.

FIG. 5 is a cross-sectional view diagram which shows the entire structure of an acceleration sensor 300 related to the third embodiment. Furthermore, in FIG. 5, the same reference symbols are attached to the same structural components as those in the acceleration sensor 100 shown in FIG. 1, FIG. 2A, FIG. 2B and FIG. 3 and an explanation of these structural components is omitted.

In FIG. 5, the acceleration sensor 300 is arranged so that the upper surface of the fixing part 110, the flexible parts 111~114 and the spindles 115~118 shown in FIG. 1, FIG. 2A, FIG. 2B and FIG. 3 is at the bottom and the bottom surface of the fixing part 110, the flexible parts 111~114 and the spindles 115~118 shown in FIG. 1, FIG. 2A, FIG. 2B and FIG. 3 is at the top. In FIG. 5, 301 is an electrode pad and 302 is a bump. The electrode pad 301 is electrically connected with the pump 302 formed on the upper surface of the substrate 160. The substrate 160 is formed with a wiring pattern (not shown in the diagram) on at least the upper surface and the wiring pattern is electrically connected with the bump 302. A wiring substrate or a through electrode substrate can be exemplified as the substrate 160 for example. In the acceleration sensor 300, by mounting a sensor on the substrate 160 using flip chip technology the wire length between the electrode pad 301 on the semiconductor substrate 101 and the wiring pattern on the substrate 160 becomes shorter than in the case of electrically connecting using wire bonding and therefore it is possible to provide an acceleration sensor with a high level of reliability. In addition, by mounting a sensor on the substrate 160 using flip chip technology it is possible to reduce a widening in a surface direction compared to the case of electrically connecting using wire bonding and miniaturization of the acceleration sensor becomes possible. Also, by mounting a sensor on the substrate 160 using flip chip technology, it is possible to manufacture the sensors at wafer levels and make the manufacturing process more efficient compared to manufacture using wire bonding. In the acceleration sensor 300 shown in FIG. 5, a structural example is shown where a lower part cap component is not arranged. However, a lower part cap component may also be arranged depending on necessity.

(Structure for Reducing the Effects of Stress in a Resin Packaging Process)

The acceleration sensor 300 is arranged with the slit 120 and linking part (not shown in the diagram) based on the knowledge described above. In addition, the acceleration sensor 300 may also be arranged with stress relief parts 211~214 for reducing changes in the resistance value of the piezo resistors due to stress. In the examples described below, in addition to changing the shape of the slit 120 and the length LR of the linking part 123, the stress generated in the acceleration sensor 300 in the case where stress relief parts 211~214 are combined was measured. As a result, the specifics of the structure which reduces the effects of stress in the acceleration sensor 300 related to the third embodiment are described in the examples below.

Furthermore, for the purposes of convenience, examples described below are explained using the exterior frame having a roughly square shaped exterior periphery, interior frame and spindles. However, the shape is not limited to this. That is, as long as the shape of the external frame, internal frame and spindle includes line symmetry, a regular polygon other than a square, a circle or elliptical shape may also be used.

Example 1

In the present example related to the present invention, the stress generated in an acceleration sensor was measured in the case of changing the shape of the slit 120, the length LR of the linking part 123 and the combination of stress relief parts 211~214 which form the structure for reducing stress in the acceleration sensors 100, 200 and 300 in the first to third embodiments described above.

(Application Conditions of Stress on a Sensor)

Figure 6A:
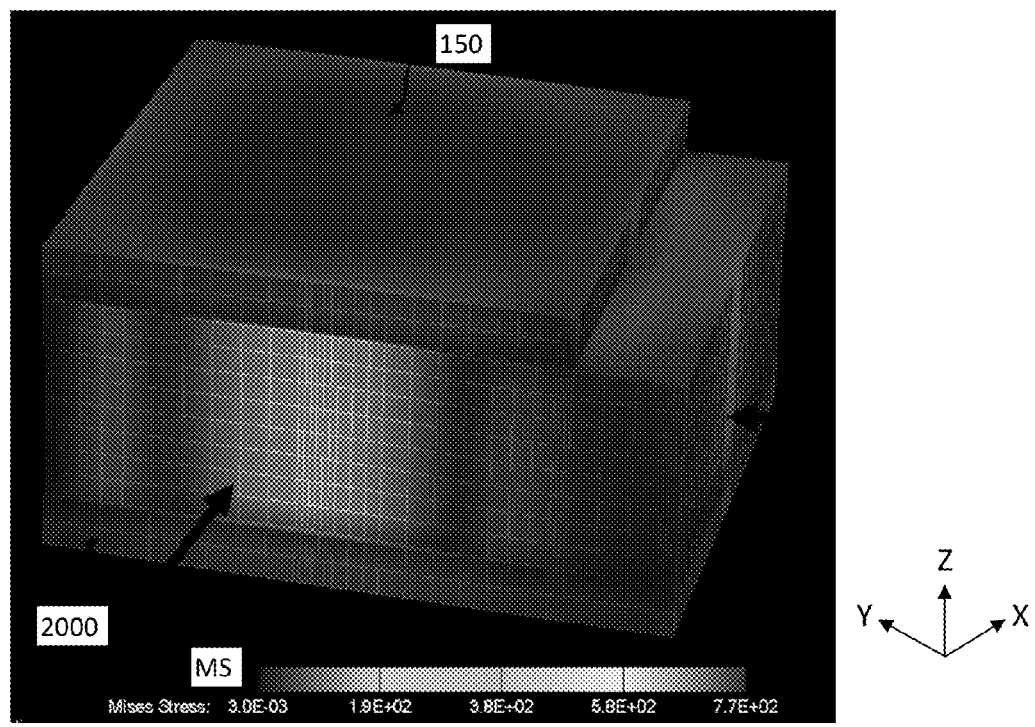
FIG. 6A is a perspective view diagram showing a condition A under which stress is applied to the acceleration sensor related to the first embodiment of the present invention, and a condition A under which stress is applied to in a state with the upper part gap component joined.
Figure 6B:
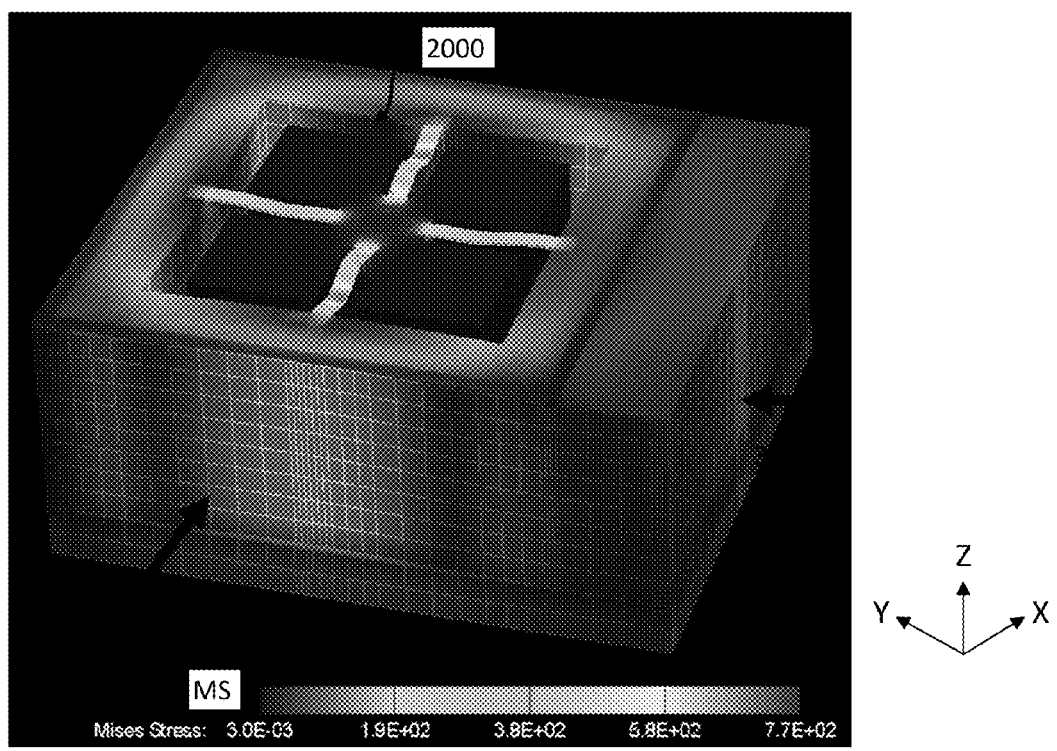
FIG. 6B is a perspective view diagram showing a condition A under which stress is applied to the acceleration sensor related to the first embodiment of the present invention, and a condition A under which stress is applied to in a state with the upper part gap component removed.

First, the conditions for the application of stress on an acceleration sensor are explained while referring to FIG. 6A, 6B, FIGS. 7A and 7B. FIGS. 6A and 6B are perspective view diagrams which exemplary show an application state of stress applied to an acceleration sensor 2000. FIG. 6A shows the state where 30 [MPa] of stress is applied to the acceleration sensor joined with an upper part cap component 150 from the X axis direction and Y axis direction shown in the diagram, and FIG. 6B shows the state where 30 [MPa] of stress is applied to the acceleration sensor without the upper part cap component 150 from the X axis direction and Y axis direction shown in the diagram. In the explanation below, the application state of stress shown in FIG. 6A and FIG. 6B is called condition A. Furthermore, in FIGS. 6A and 6B, the parts transformed due to stress in the acceleration sensor 2000 are shown by a change in color in which a bar MS (sequential change from purple to green to red) which shows a change in color in each diagram is used as a reference. In this case, the amount of transformation becomes gradually larger according to the change in color from purple to green to red.

Figure 7A:
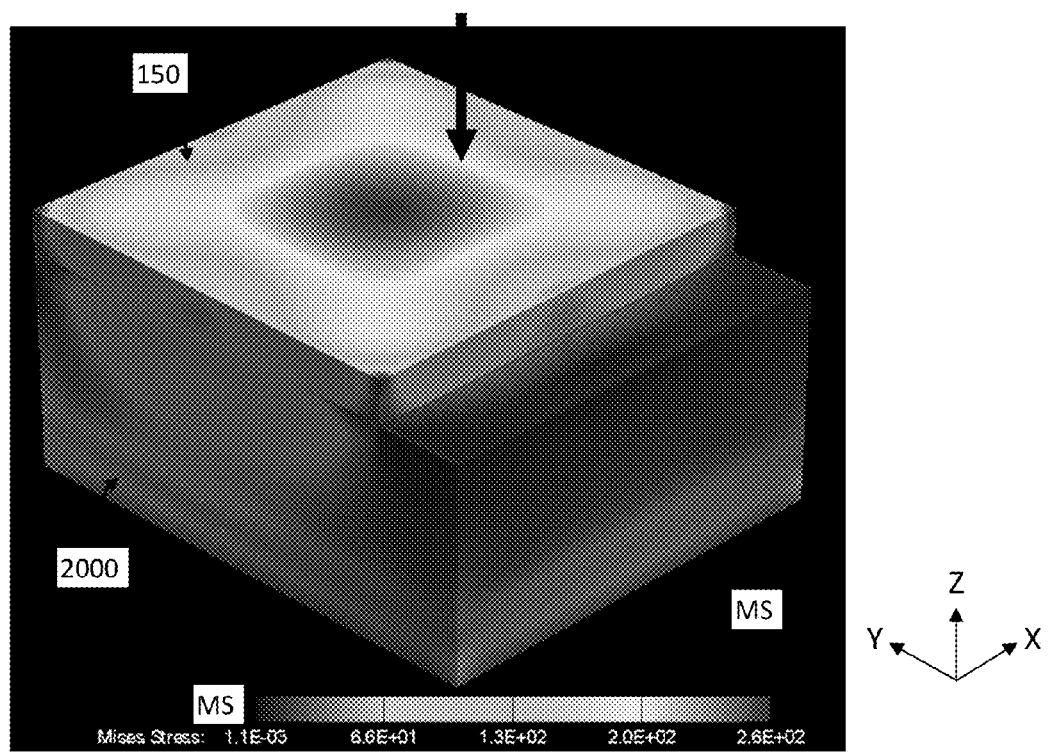
FIG. 7A is a perspective view diagram showing a condition B under which stress is applied to the acceleration sensor related to the first embodiment of the present invention, and a condition A under which stress is applied to in a state with the upper part gap component joined.
Figure 7B:
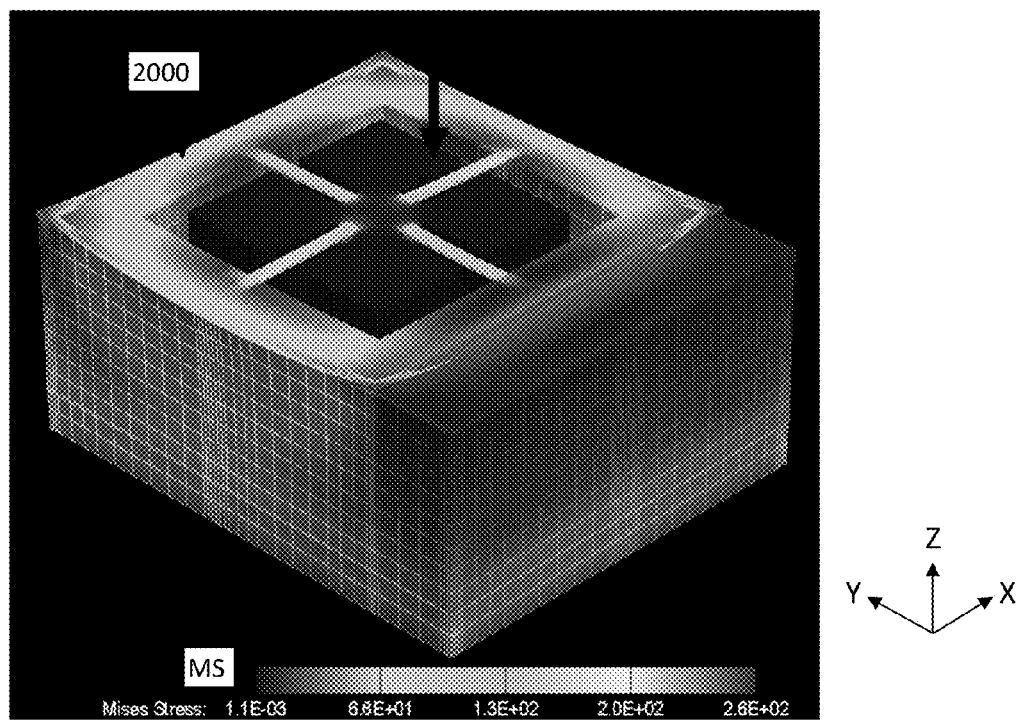
FIG. 7B is a perspective view diagram showing a condition B under which stress is applied to the acceleration sensor related to the first embodiment of the present invention, and a condition A under which stress is applied to in a state with the upper part gap component removed.

FIGS. 7A and 7B are perspective view diagrams which exemplary shown the application state of stress applied to the acceleration sensor 2000. FIG. 7A shows the state where 10 [MPa] of stress is applied to the acceleration sensor 2000 joined with the upper part cap component 150 from the Z axis direction shown in the diagram, and FIG. 7B shows the state where 10 [MPa] of stress is applied to the acceleration sensor 2000 without the upper part cap component 150 from the Z axis direction shown in the diagram. In the explanation below, the application state of stress shown in FIG. 7A and FIG. 7B is called condition B. Furthermore, in FIGS. 7A and 7B, the parts transformed due to stress in the acceleration sensor 130 are shown by a change in color in which a bar MS (sequential change from purple to green to red) which shows a change in color in each diagram is used as a reference. In this case, the amount of transformation becomes gradually larger according to the change in color from purple to green to red.

(Transformation of a Sensor when Stress is Applied)

Figure 8A:
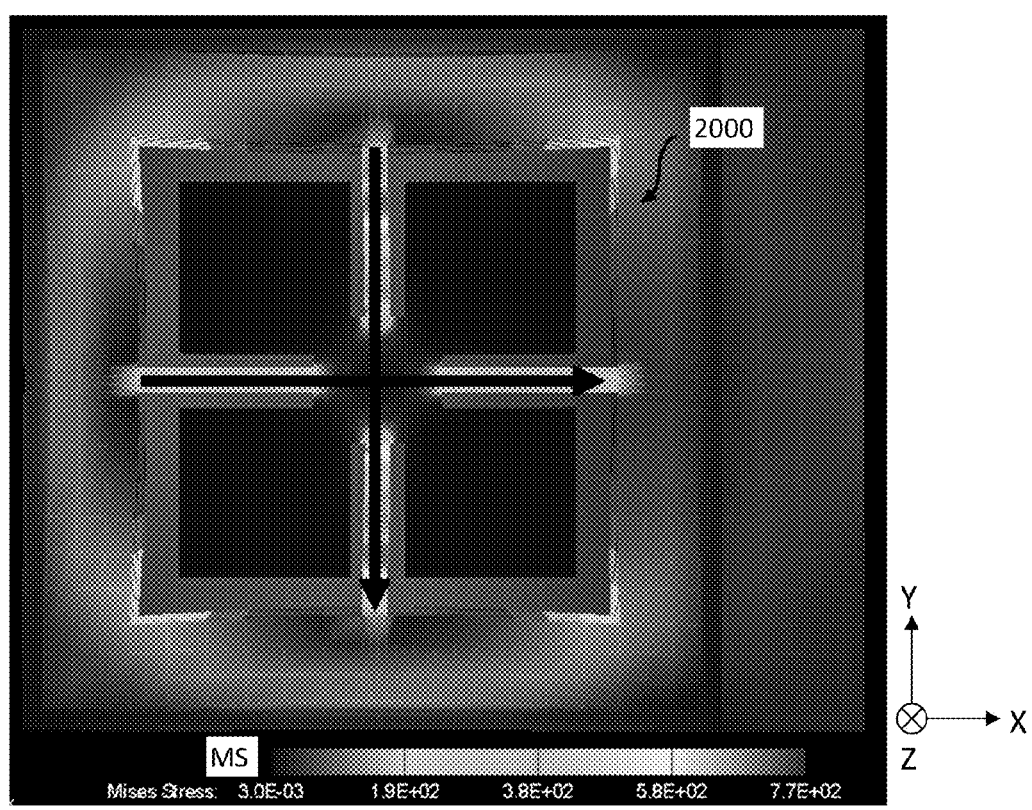
FIG. 8A is a planar view diagram showing a transformation state of a sensor when stress is applied to the acceleration sensor under condition A related to example 1.
Figure 8B:
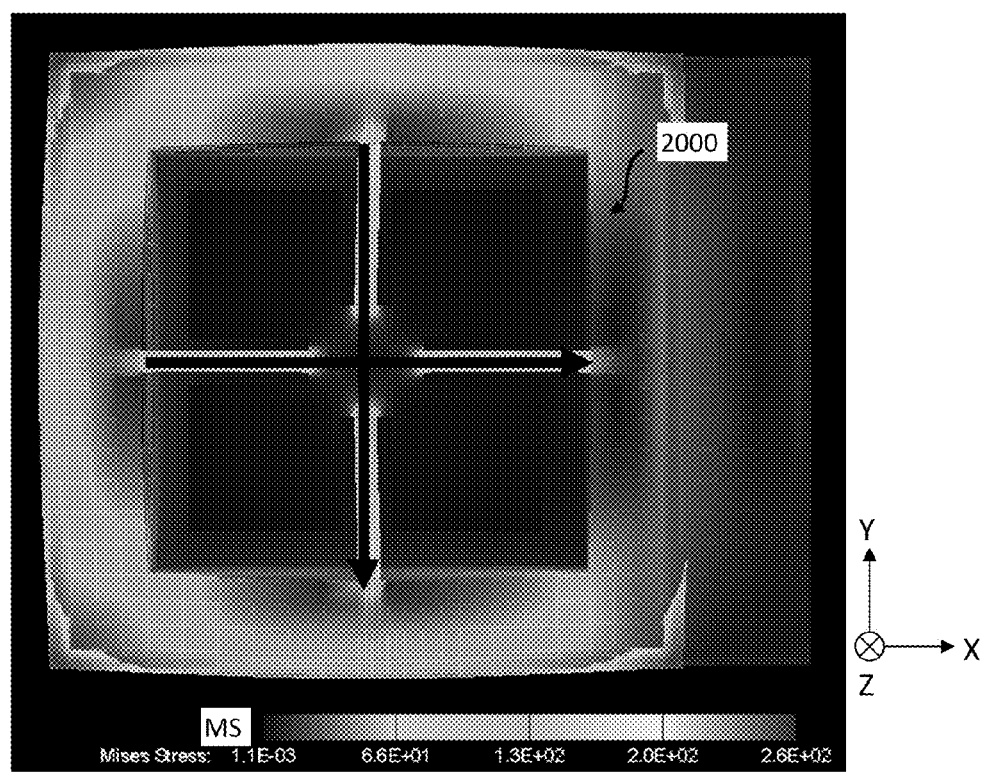
FIG. 8B is a planar view diagram showing a transformation state of a sensor when stress is applied to the acceleration sensor under condition B related to example 1.

Next, the transformation state of the acceleration sensor 2000 when stress is applied under condition A and condition B described above is shown in FIGS. 8A and 8B. FIG. 8A is a planar view diagram which shows the transformation state of the acceleration sensor 2000 when stress is applied according to condition A. FIG. 8B is a planar view diagram which shows the transformation state of the acceleration sensor 2000 when stress is applied according to condition B. Furthermore, in the acceleration sensors 2000 shown in FIGS. 8A and 8B, the slit 120, the linking part 123 and stress relief parts 211~214 are not arranged. In the case where stress is applied according to condition A as shown in FIG. 8A, the entire acceleration sensor 2000 transforms in a recessed shape in an interior side direction (X axis direction and Y axis direction) with the flexible part largely at the center. In the case where stress in applied according to condition B as shown in FIG. 8B, the entire acceleration sensor 2000 transforms in a convex shape in an exterior side direction (X axis direction and Y axis direction) with the flexible part largely at the center. From these results, it was found that the acceleration sensor 2000 transforms with the flexible part at the center in the case where stress is applied according to condition A and condition B. That is, it was judges that a structure including the slit 120 and linking part 123 or the stress relief parts 211~214 shown in the first and second embodiments described above is necessary as a structure for reducing the effects of stress applied on the flexible part during the resin packaging process.

Example 2

Next, based on the results in example 1 described above, an example where each structure of the slit part 120, the linking part 123 and stress relief parts 211~214 are combined in the acceleration sensor 2000 and the stress received by a flexible part which is applied with stress according to condition A is measured is explained while referring to FIG. 9~FIG. 12 shown below. In the acceleration sensor 2000 shown in FIG. 9~FIG. 12, the size of the stress received by the flexible parts 201~204 which are applied with stress according to condition A is measured in the case where the slit 120 and the linking part 123 are arranged, in the case where the stress relief parts 211~214 are arranged and in the case where the position and length L of the linking part 123 is changed.

Figure 9A:
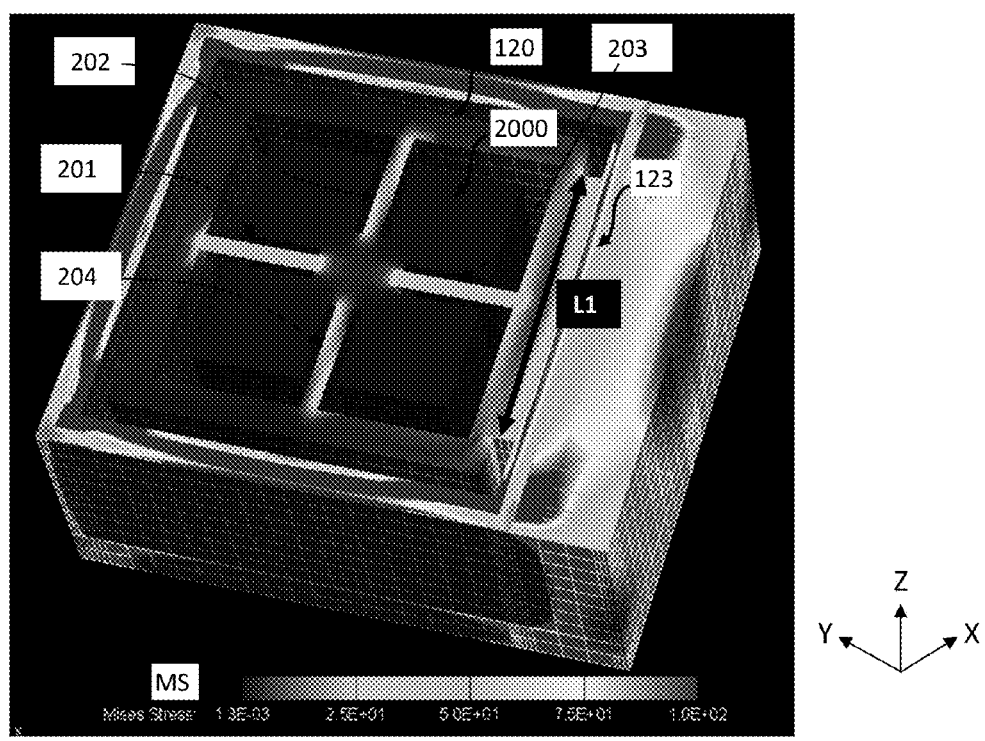
FIG. 9A is a perspective view diagram showing a state of stress received by a sensor when stress is applied to a type A structure acceleration sensor under condition A related to example 2 of the present invention.
Figure 9B:
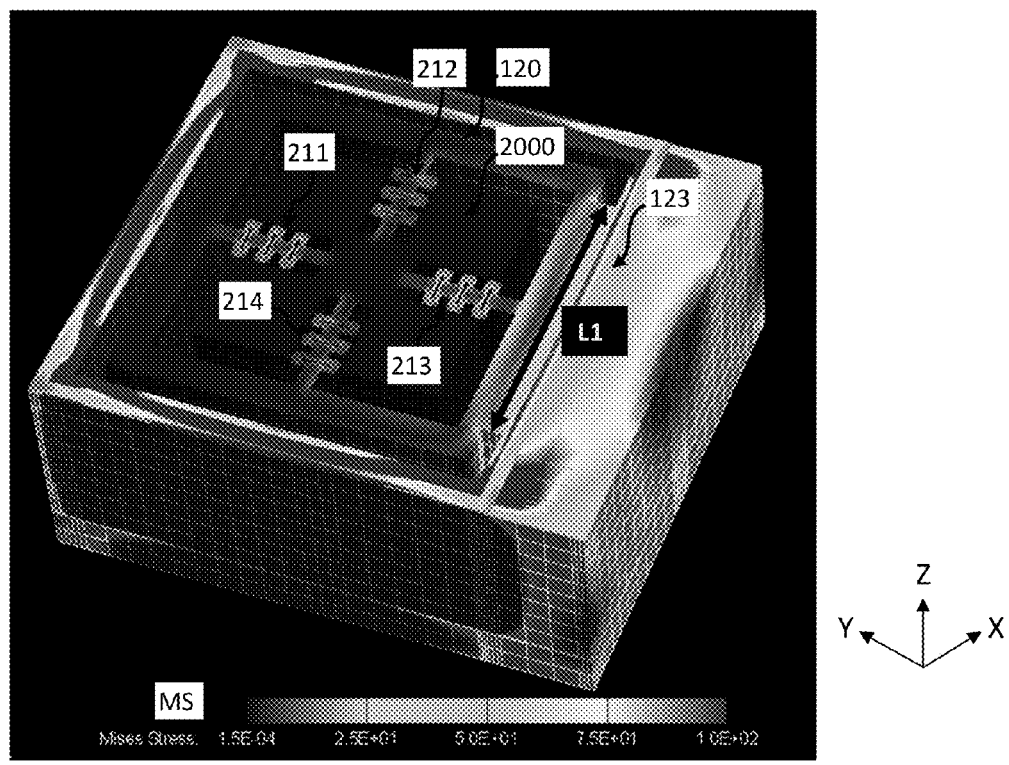
FIG. 9B is a perspective view diagram showing a state of stress received by a sensor when stress is applied to a type B structure acceleration sensor under condition A related to example 2 of the present invention.

FIG. 9 is a perspective view diagram which shows the result of measuring stress received by the acceleration sensor 2000 in the case where the slit 120 and the linking part 123 are arranged on the periphery of the acceleration sensor 2000 when stress is applied under condition A. The length of the linking part 123 arranged on the acceleration sensor 2000 shown in FIG. 9A is L1 (660 [μm]), which is the almost same as the length of the entire right side edge of the acceleration sensor 2000 in the diagram. The structure of the acceleration sensor 2000 shown in FIG. 9A is called [type A]. FIG. 9B is a perspective view diagram which shows the result of measuring the size of stress received by the acceleration sensor 2000 in the case where the slit 120 and the linking part 123 are arranged on the periphery of the acceleration sensor 2000 and the stress relief parts 211~214 are arranged when stress is applied under condition A. The length of the linking part 123 arranged on the acceleration sensor 2000 shown in FIG. 9B is L1 the same as in FIG. 9A. The structure of the acceleration sensor 2000 shown in FIG. 9B is called [type B]. In the type A acceleration sensor 2000 shown in FIG. 11A, it was found that the effects of stress according to condition reached the flexible part. In the type B acceleration sensor 2000 shown in FIG. 9B, it was found that the effects of stress on the flexible part was less compared to type A.

Figure 10A:
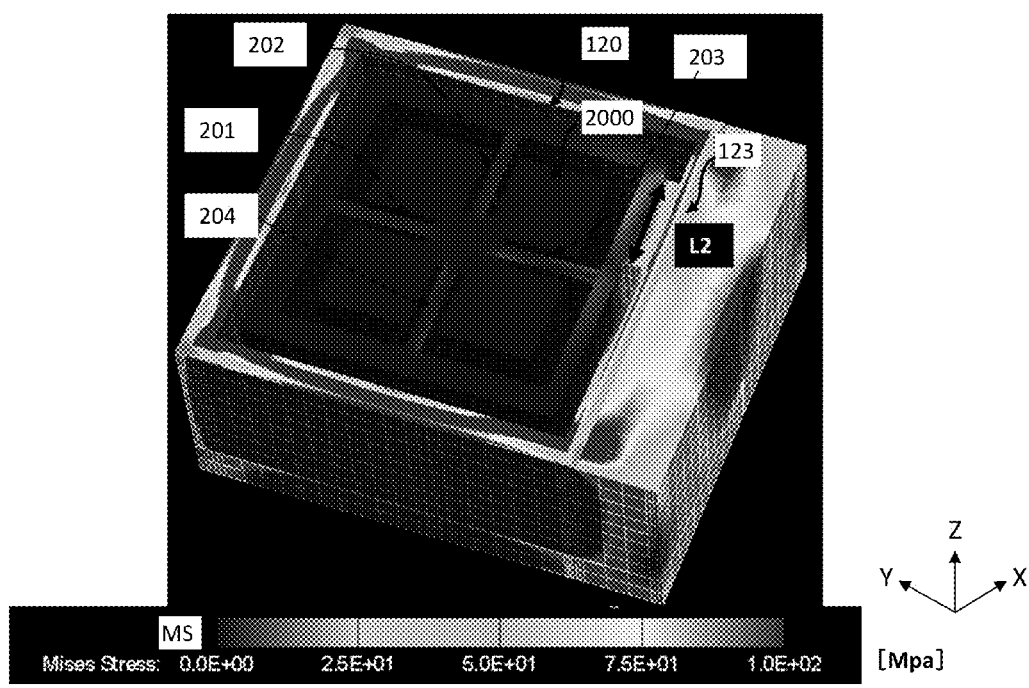
FIG. 10A is a perspective view diagram showing a state of stress received by a sensor when stress is applied to a type C structure acceleration sensor under condition A related to example 2.
Figure 10B:
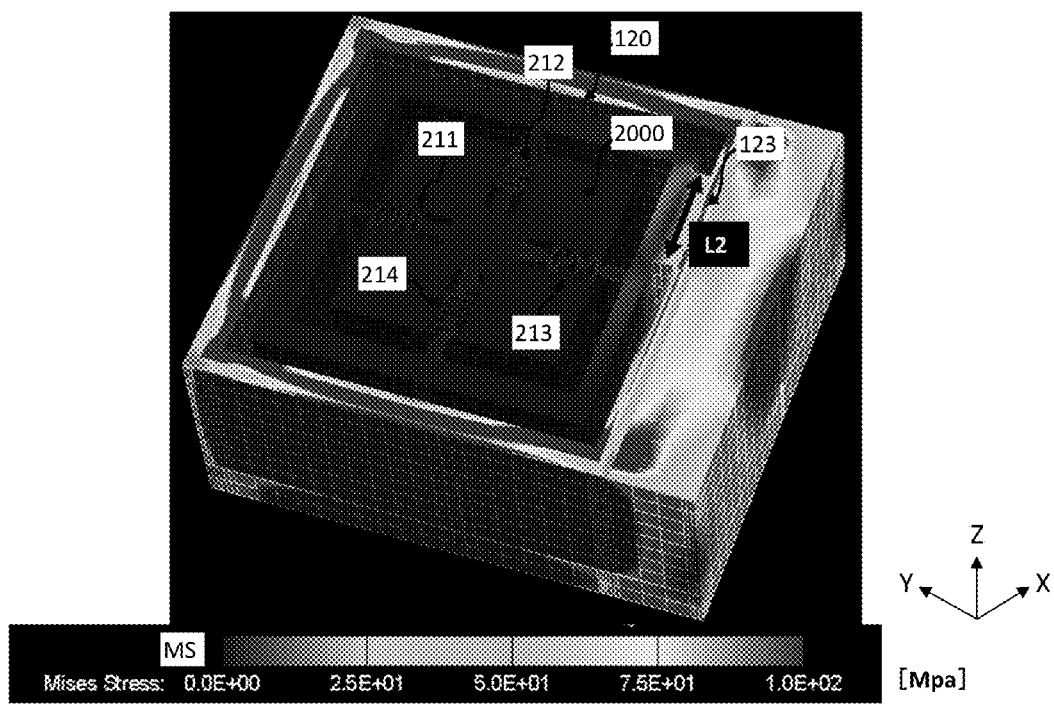
FIG. 10B is a perspective view diagram showing a state of stress received by a sensor when stress is applied to a type D structure acceleration sensor under condition A related to example 2.

In the acceleration sensor 2000 shown in FIG. 10A, the length, given as L2 (270 [μm]), of the linking part 123 is reduced with respect to the type A structure, and its position is formed on the upper part of the right edge away from the position facing the flexible part 203. The structure of the acceleration sensor 2000 shown in FIG. 10A is called [type C]. In the acceleration sensor 2000 shown in FIG. 10B, the length L2 of the linking part 123 is reduced with the respect to type B just like the type C, and its position is formed on the upper part of the right edge away from the position facing the flexible part. In the case of the structure of the acceleration sensor 2000 shown in FIG. 10B is called [type D]. The type C and type D acceleration sensors 2000, it was found that the effects of stress on a flexible part were less compared to the effects of stress on a flexible part in the type A and type B structures. In type C and type D structures, it was found that the effects of stress applied to the flexible parts 201~204 according to condition A is less compared to the type A and type B structures.

Figure 11A:
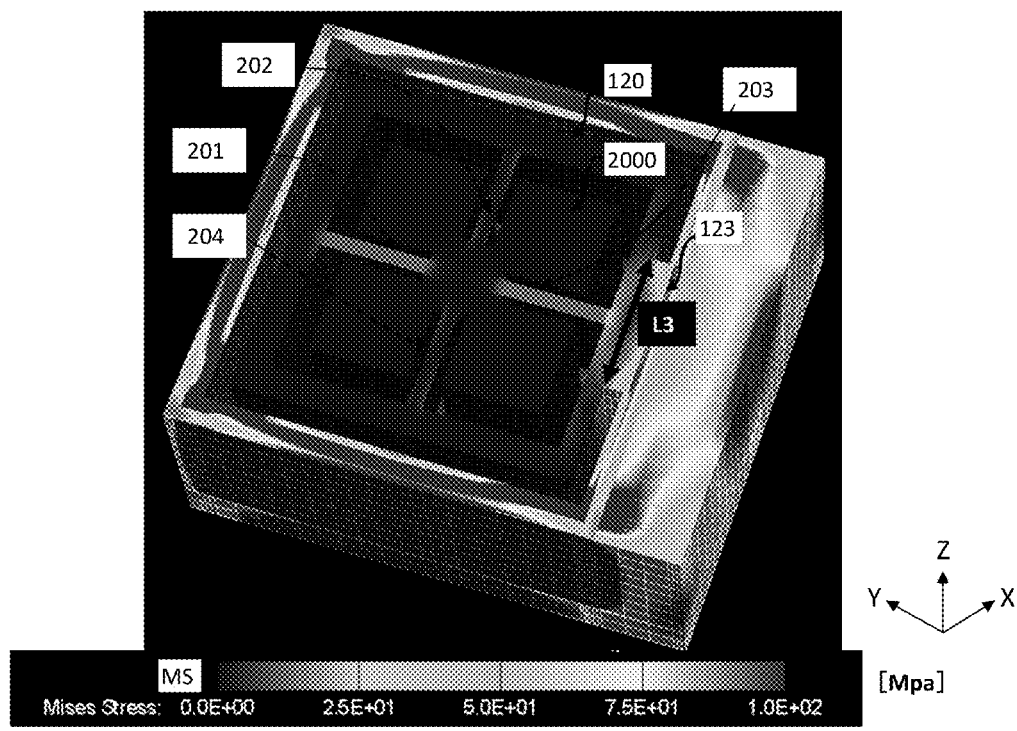
FIG. 11A is a perspective view diagram showing a state of stress received by a sensor when stress is applied to a type E structure acceleration sensor under condition A related to example 2.
Figure 11B:
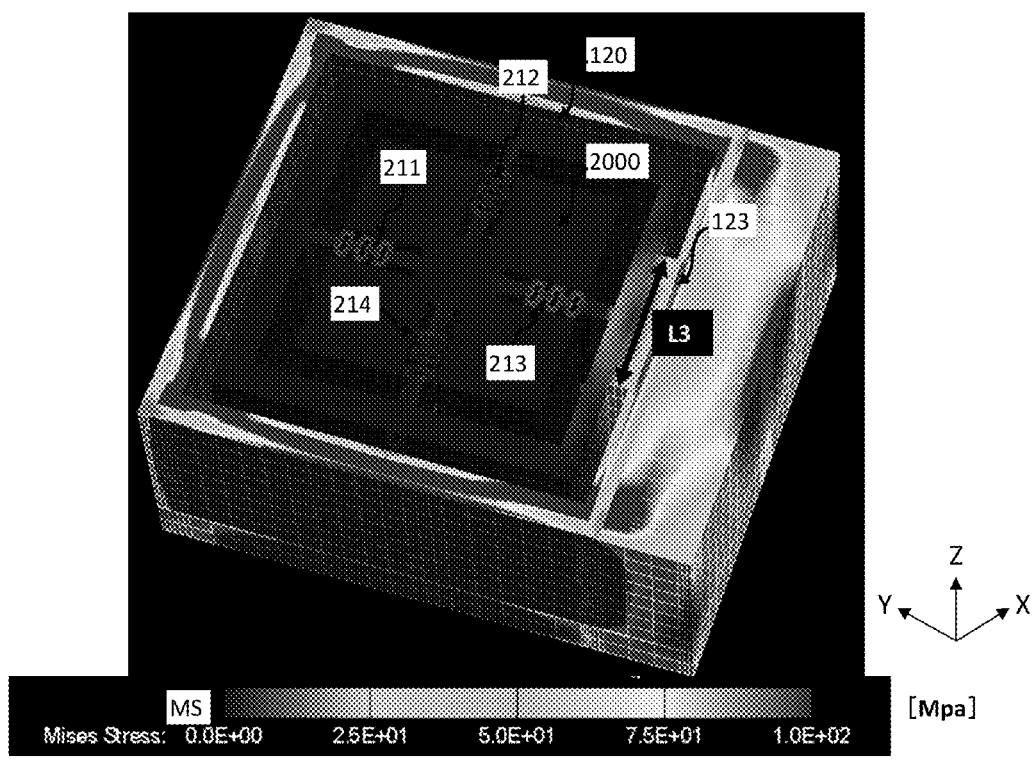
FIG. 11B is a perspective view diagram showing a state of stress received by a sensor when stress is applied to a type F structure acceleration sensor under condition A related to example 2.
Figure 13A:
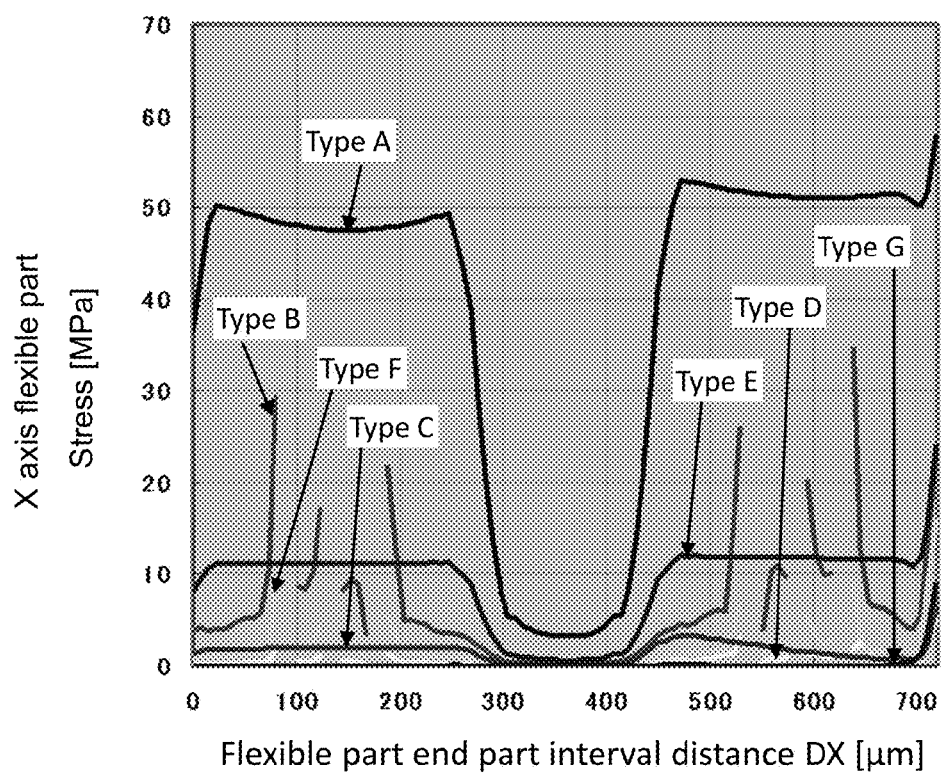
FIG. 13A is a perspective view diagram showing a state of stress received by a flexible part in an X axis direction of a sensor when stress is applied to each type A~H of structure acceleration sensor under condition A related to example 2.
Figure 13B:
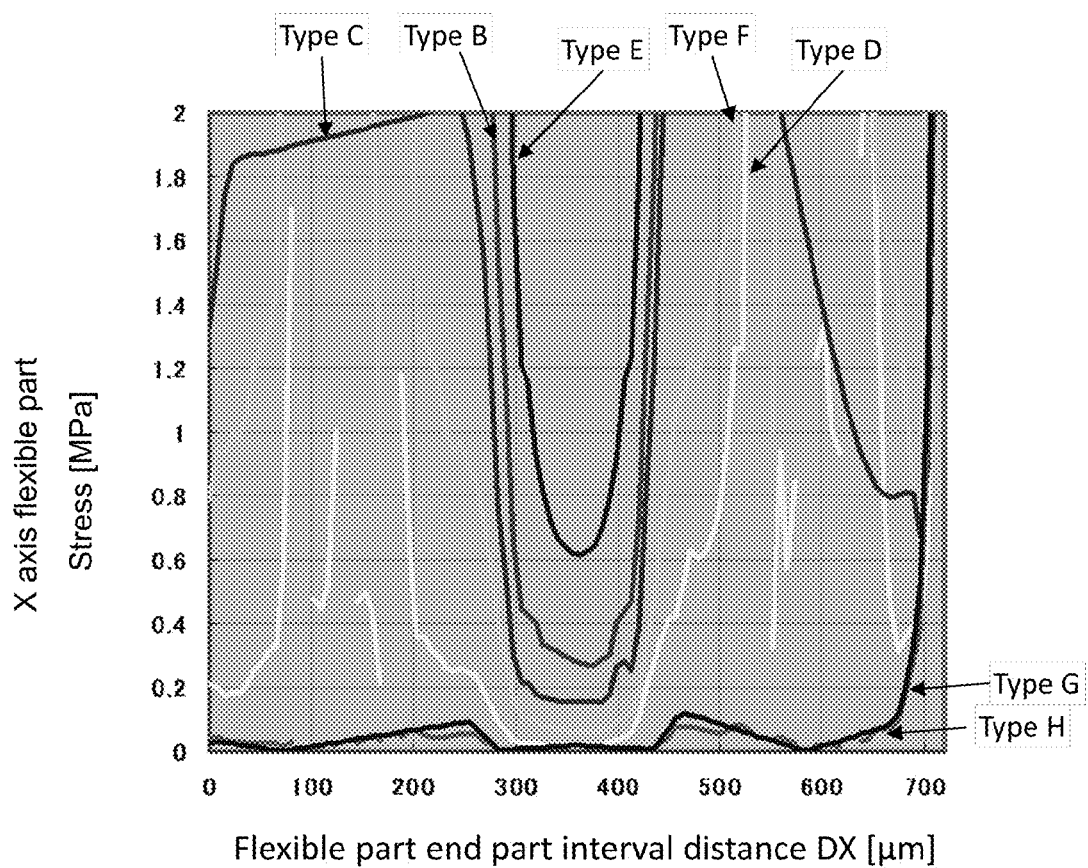
FIG. 13B is a graph showing an expanded view of a 0 [MPa]~2 [MPa] section from the range of stresses in the graph in FIG. 13A related to example 2.

In the acceleration sensor 2000 shown in FIG. 11A and FIG. 11B, the length, given as L3 (340 [μm]), of the linking part 123 is reduced with respect to the type A and type B structures, and its position is formed at the center part of the right edge facing the flexible part 203. However, the length L3 of the linking part 123 is longer than the length L2 of the type C and type D linking part 123. Each structure of the acceleration sensor 2000 shown in FIG. 13A and FIG. 13B are called [type E] and [type F]. The type E and type F acceleration sensors 2000 were found to have less effects of stress on a flexible part compared to the effects of stress on a flexible party in both type A and type B structures. However, it was found that the effects of stress on a flexible part in the type E and type F acceleration sensors 2000 were larger than the effects of stress the flexible parts 201~204 in the type C and type D acceleration sensors 2000.

Figure 12A:
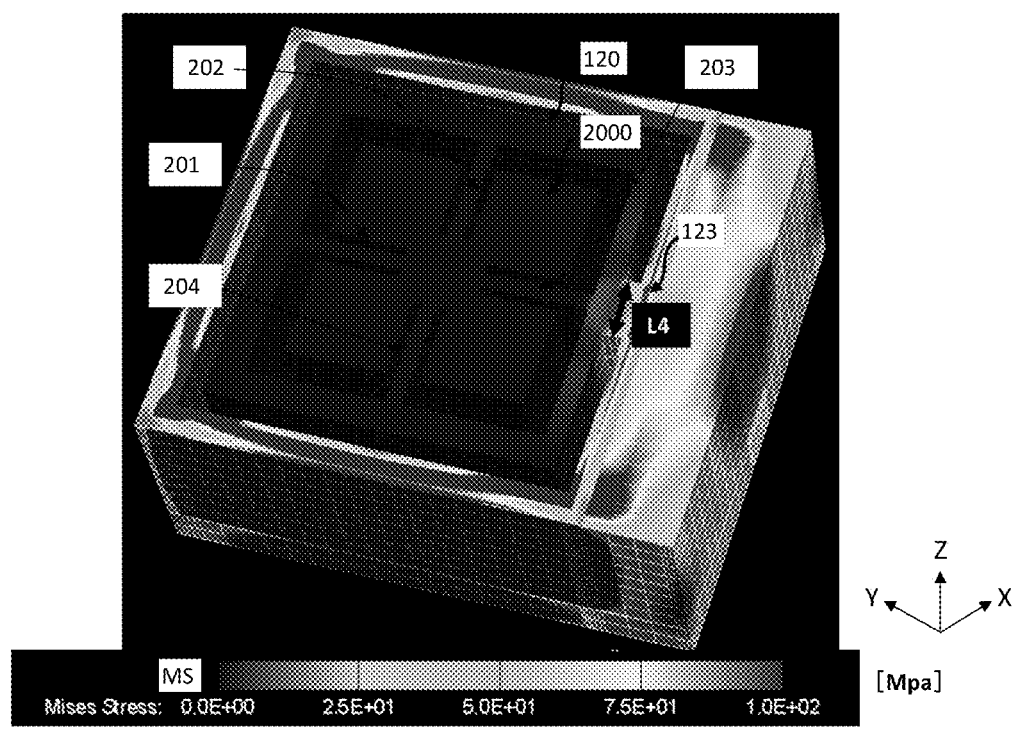
FIG. 12A is a perspective view diagram showing a state of stress received by a sensor when stress is applied to a type G structure acceleration sensor under condition A related to example 2.
Figure 12B:
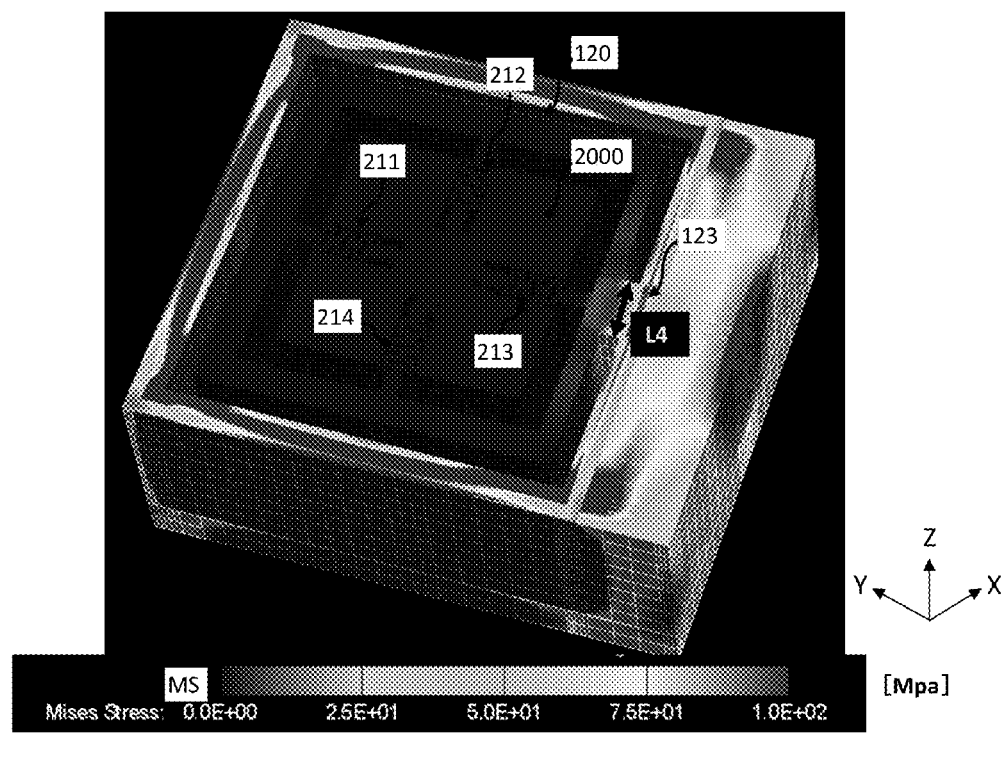
FIG. 12B is a perspective view diagram showing a state of stress received by a sensor when stress is applied to a type H structure acceleration sensor under condition A related to example 2.

In the acceleration sensor 2000 shown in FIG. 12A and FIG. 12B, the length, given as L4 (140 [μm]), of the linking part 123 is reduced with respect to the type E and type E structures, and its position is formed at the center part of the right edge facing the flexible part 203. However, the length L4 of the linking part 123 is the shortest among the lengths L1~L3 of type A type to type F linking parts 123. Each structure of the acceleration sensor 2000 shown in FIG. 12A and FIG. 12B are called [type G] and [type H]. The type G and type H acceleration sensors 2000 were found to have less effects of stress on a flexible part compared to the effects of stress on a flexible party in type A to type F structures. That is, it was found that the effects of stress on a flexible part in the type G and type H acceleration sensors 2000 were the lowest.

Next, the results of measuring the stress received by a flexible part of the acceleration sensor 2000 when stress is applied under condition A in each of the type A~H structures shown in FIG. 9~FIG. 12 are explained while referring to FIG. 13~FIG. 17.

FIG. 13A and FIG. 13B are graphs which show the results of measuring the size of the stress received by a flexible part of the acceleration sensor 2000 in the case that stress is applied under condition A in each of the type A~H structures when a flexible part end part interval distance DX which shows the position of a flexible part in an X axis direction is given as a parameter. The flexible part end part interval distance DX is the distance between end parts of the flexible parts 111 and 113 facing the X axis direction which are connected to the fixing part 110 as is shown in FIG. 1 and FIG. 4. FIG. 13A and FIG. 13B are graphs which plot the distribution of stress generated in each predetermined position at a flexible part end part interval distance DX of the flexible parts 111 and 113 in an X axis direction of the acceleration sensor 2000 when stress is applied under condition A to each of type A~H structure. FIG. 13A is a graph which plots the results of measuring stress generated at each predetermined position at a flexible part end part interval distance DX of the flexible parts 111 and 113 in an X axis direction when the horizontal axis is given as the flexible part end part interval distance DX range 0 [μm]~700 [μm] and the vertical axis is given as a stress range 0 [MPa]~70 [MPa]. FIG. 13B is a graph which shows an expanded view of the section 0 {MPa}~2 {MPa} from the range of stresses in the graph of FIG. 13A. In FIG. 13A and FIG. 13B, the flexible part end part interval distance DX is shown in the case where the flexible part end part interval distance DX facing the X axis direction shown in FIG. 1 and FIG. 4 is 700 [μm].

In FIG. 13A and FIG. 13B, it was found that the order in which a change in stress received by a flexible part in an X axis direction when stress is applied under condition A was largest is as follows:

type $A$>type $B$>type $C$>type $E$>type $F$>type $G$> (type $H$)

It was found that the size of the stress received by a flexible part in type B, type D and type F in which the stress relief parts 211~214 are further combined was smaller compared to the size of the stress received by a flexible part in type A, type C and type E in which the slot 120 and linking part 123 are combined. However, in type G and type H in which the length L4 of the linking part 123 was reduced the most, it was found that the reduction in stress effects due to the slot 120 and linking part 123 was larger than the reduction in stress effects due to the stress relief parts 211~214. From the measurement results described above it was found that the most effective structure for reducing the effects of stress applied to the acceleration sensor 2000 in a resin packaging process was pattern G which is the structure in which the length L4 of the linking part 123 was reduced the most and which is combined with the slot 120 and the linking part 123. This measurement result is shown in FIG. 14.

Figure 15A:
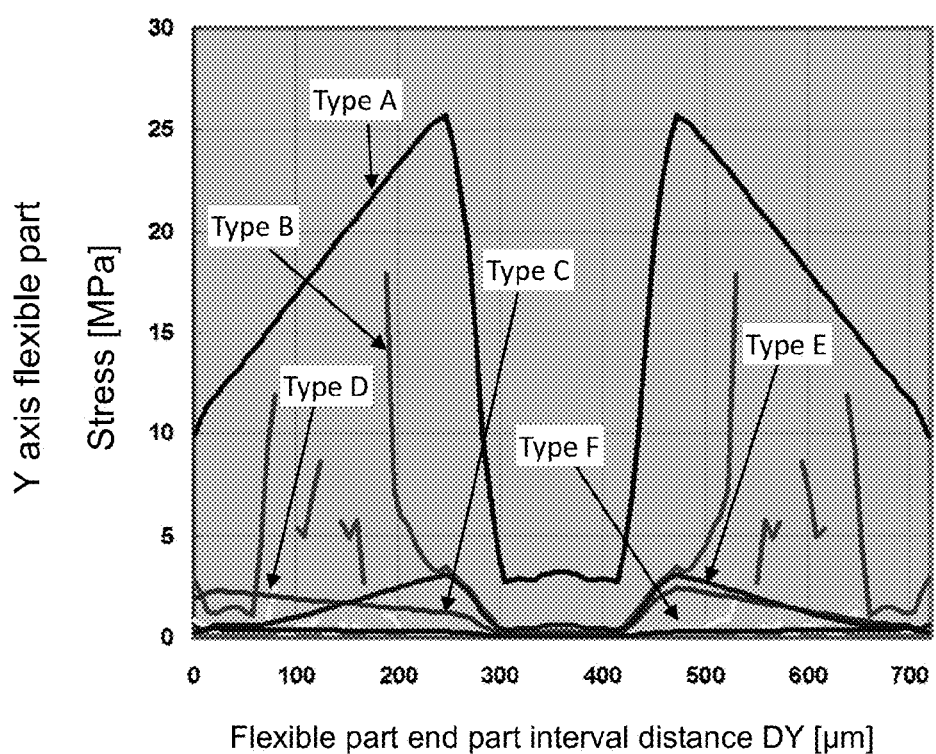
FIG. 15A is a graph showing the results of measuring the size of stress received by a flexible part in a Y axis direction of a sensor when stress is applied under condition A to each structure of type A~H related to example 2.
Figure 15B:
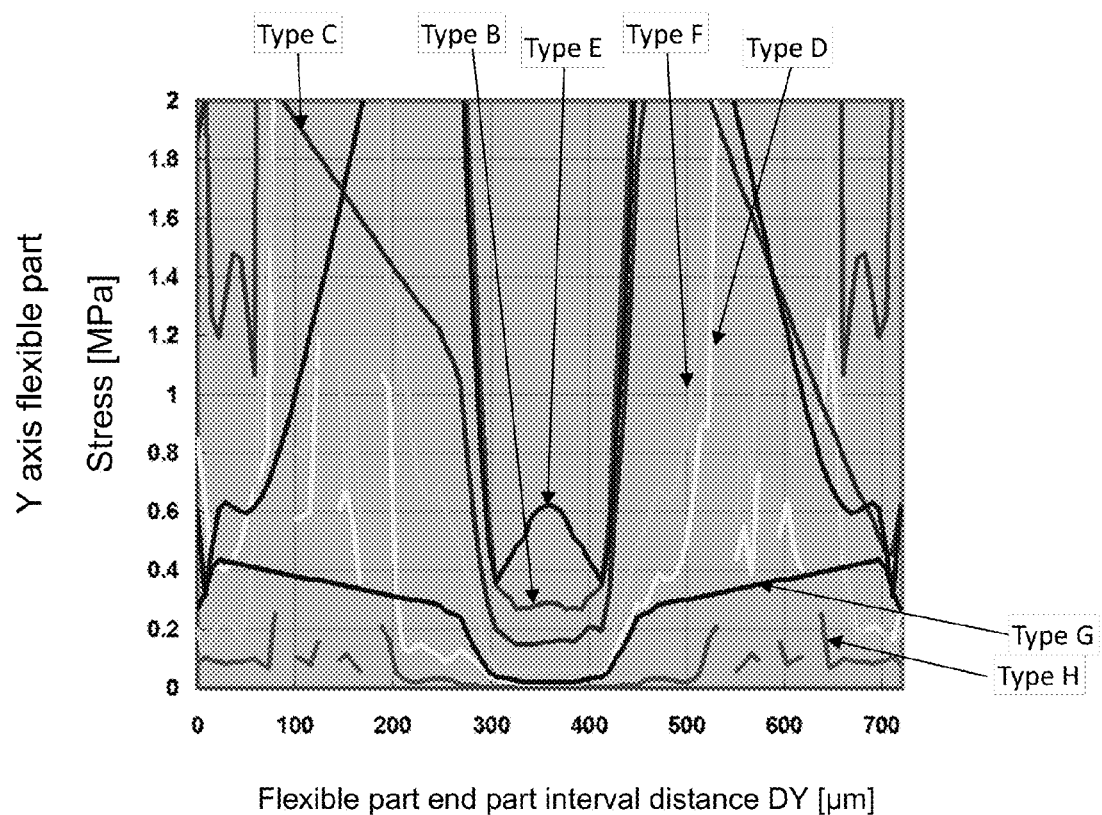
FIG. 15B is a graph showing an expanded view of a 0 [MPa]~2 [MPa] section from the range of stresses in the graph in FIG. 15A related to example 2.

FIG. 15A and FIG. 15B are graphs which plot the distribution of stress generated in each predetermined position at a flexible part end part interval distance DY of the flexible parts 112 and 114 in a Y axis direction of the acceleration sensor 2000 when stress is applied under condition A to each of type A~H structure. The flexible part end part interval distance DY is the distance between end parts of the flexible parts 112 and 114 facing the Y axis direction, which are connected to the fixing part 110 as is shown in FIG. 1 and FIG. 4. FIG. 15A is a graph which plots the results of measuring stress when the horizontal axis is given as the flexible part end part interval distance DY range 0 [μm]~700 [μm] and the vertical axis is given as a stress range 0 [MPa]~70 [MPa]. FIG. 15B is a graph which shows an expanded view of the section 0 {MPa}~2 {MPa} from the range of stresses in the graph of FIG. 15A. Furthermore, in FIG. 15A and FIG. 15B, the flexible part end part interval distance DY is shown in the case where the flexible part end part interval distance DY facing the Y axis direction shown in FIG. 1 and FIG. 4 is 700 [μm].

In FIG. 15A and FIG. 15B, it was found that the order in which a change in stress received by a flexible part in a Y axis direction when stress is applied under condition A was largest is as follows:

type A>type B>type C>type E>type F>type G>type H

It was found that the size of the stress received by a flexible part in type B, type D, type F and type H in which the stress relief parts 211~214 are further combined was smaller compared to the size of the stress received by a flexible part in type A, type C, type E and type G in which the slot 120 and linking part 123 are combined. From the measurement results described above it was found that the most effective structure for reducing the effects of stress applied to the acceleration sensor 2000 in a resin packaging process was pattern H which is the structure in which the length L of the linking part 123 was reduced the most and which is combined with the slot 120, the linking part 123 and the stress relief parts 211~214. This measurement result is shown in FIG. 16.

From the stress measurement results shown in FIG. 13~FIG. 15 described above, it was found that the structure in which the effects of reducing stress received by a flexible part in a sensor during a resin packaging process are large was the structure in which a slit is arranged across roughly the entire periphery of the sensor and where the length LR of the linking part is reduced as much as possible within a range in which strength can be maintained. In addition, it was found that it is effective to arrange stress relief parts in the case where the length L of the linking part can not be reduced. Furthermore, the length LR of the linking part may be any length as long as it does not restrict the layout of a plurality of metal wires which electrically connect the plurality of piezo resistor elements Rx1~Rx4, Ry1~Ry4, Rz1~Rz4 shown in FIG. 1. For example, in the case of an acceleration sensor which detects acceleration in a tri-axial direction, if the length LR of the linking part is 50 [μm] or more, the layout of metal wires is not obstructed.

Example 3

Next, based on the results in example 1 described above, an example where each structure of the slit part, the linking part and stress relief parts are combined in the acceleration sensor, and the shape of the slit and the shape and number of stress relief parts is changed and the stress received by a flexible part which is applied with stress according to condition A and condition B is measured is explained while referring to FIG. 17~FIG. 27 shown below. In the acceleration sensors 400~1300 shown in FIG. 17~FIG. 21, the size of the stress received by the flexible parts which are applied with stress according to condition A and condition B is measured in the case where the slit and the linking part are arranged, the shape of the slit, the position and length L of the linking part, and the shape and number of stress relief parts are changed.
(Structure of an Acceleration Sensor)

Figure 17A:
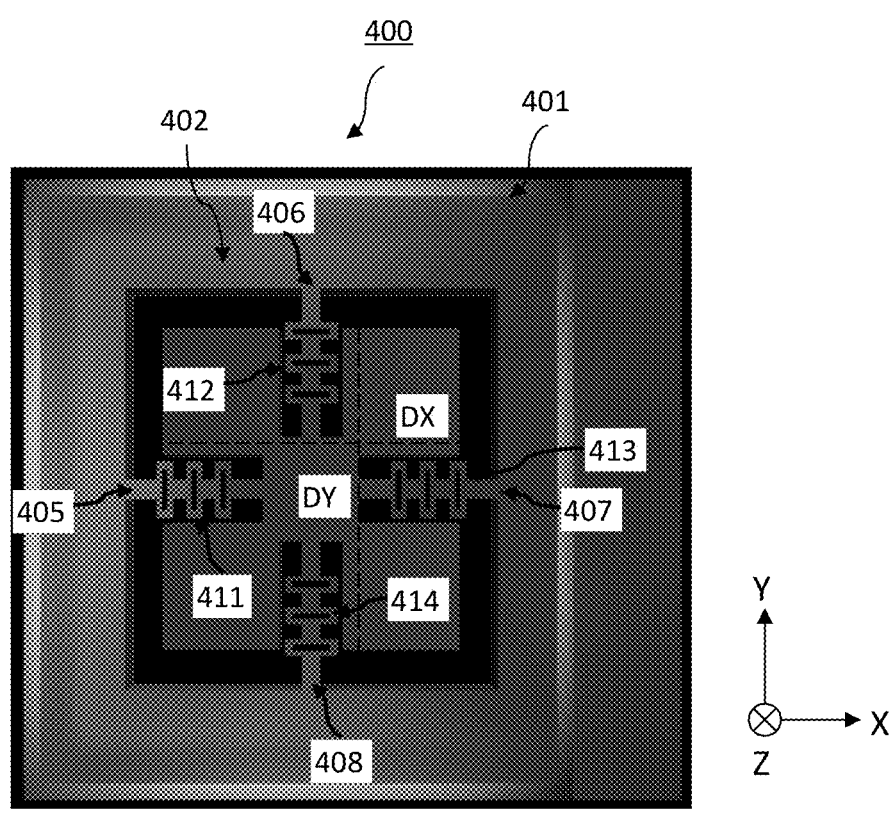
FIG. 17A is a diagram showing a structure of an acceleration sensor related to the example 3 of the present invention and a planar view diagram showing an approximate structure of type A1.
Figure 17B:
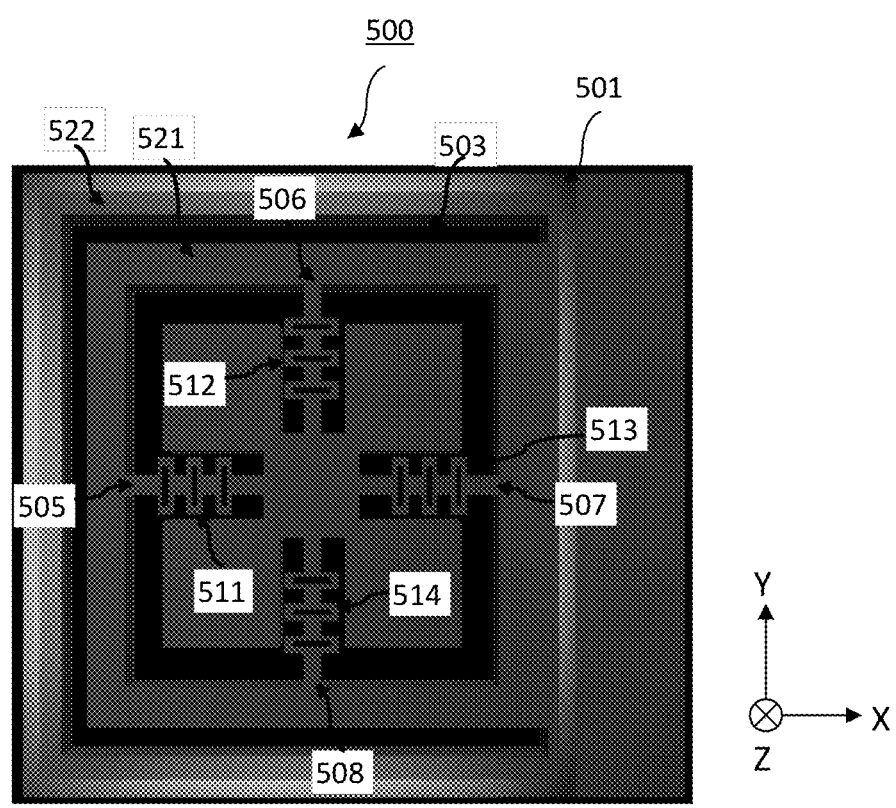
FIG. 17B is a diagram showing a structure of an acceleration sensor related to the example 3 of the present invention and a planar view diagram showing an approximate structure of type B1.

FIG. 17A is a planar view diagram of an approximate structure of an acceleration sensor 400 seen from the upper surface. The acceleration sensor 400 in FIG. 17A is arranged with stress relief parts 411~414 on flexible parts 405~408 formed on a semiconductor substrate 401. One end of each of the flexible parts 405~408 is connected to a fixing part 402. The structure of the acceleration sensor 400 shown in FIG. 17A is called [type A1]. FIG. 17B is a planar view diagram of an approximate structure of an acceleration sensor 500 seen from the upper surface. The acceleration sensor 500 in FIG. 17B is arranged with stress relief parts 511~514 on flexible parts 505~508 formed on a semiconductor substrate 501 and further arranged with a slit 503. The slit 503 passes through the semiconductor substrate 501 in a Z axis direction in the diagram and is arranged to enclose three edges of the periphery of the flexible parts 505~508. The semiconductor substrate 601 is divided by the slit 503 into an interior frame 521 which includes the flexible parts 505~508 and an exterior frame 522 which is positioned on the periphery of the interior frame 521. The structure of the acceleration sensor 500 shown in FIG. 17B is called [type B1]. Furthermore, the structure of the stress relief parts 411~414 shown in FIG. 17A is the same as the structure of the stress relief parts 511~514 shown in FIG. 17B.

Figure 18A:
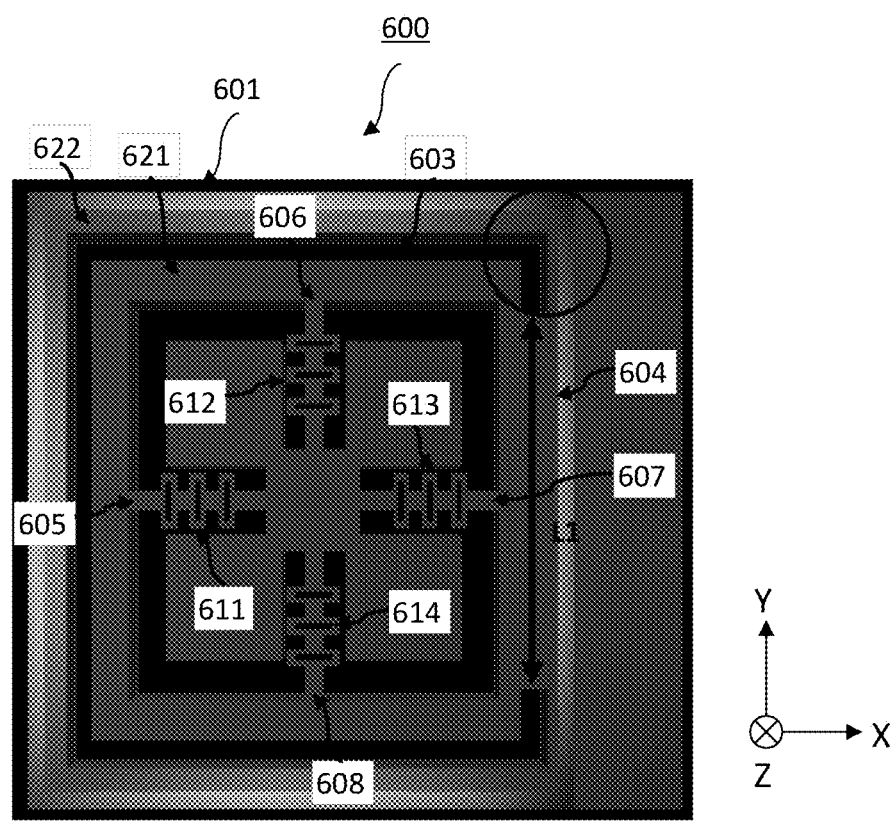
FIG. 18A is a diagram showing a structure of an acceleration sensor related to example 3 and a planar view diagram showing an approximate structure of type C1.

FIG. 18A is a planar view diagram of an approximate structure of an acceleration sensor 600 seen from the upper surface. The acceleration sensor 600 in FIG. 18A is arranged with stress relief parts 611~614 on flexible parts 605~608 formed on a semiconductor substrate 601 and is further arranged with a slit 603 and a lining part 604. The structure of the acceleration sensor 600 shown in FIG. 18A is called [type C1]. The slit 603 passes through the semiconductor substrate 601 in a Z axis direction in the diagram and is arranged to mainly enclose three edges of the periphery of the flexible parts 605~608. The slit 603 is also arranged at a section which encloses using a circle which is different to the shape of the slit 503 shown in FIG. 17B. The semiconductor substrate 601 is divided by the slit 603 into an interior frame 621 which includes the flexible parts 605~608 and an exterior frame 622 which is positioned on the periphery of the interior frame 621. The interior frame 612 and the exterior frame 622 are linked by the linking part 604. The length of the linking part 604 is L1 (600 [μm])

Figure 18B:
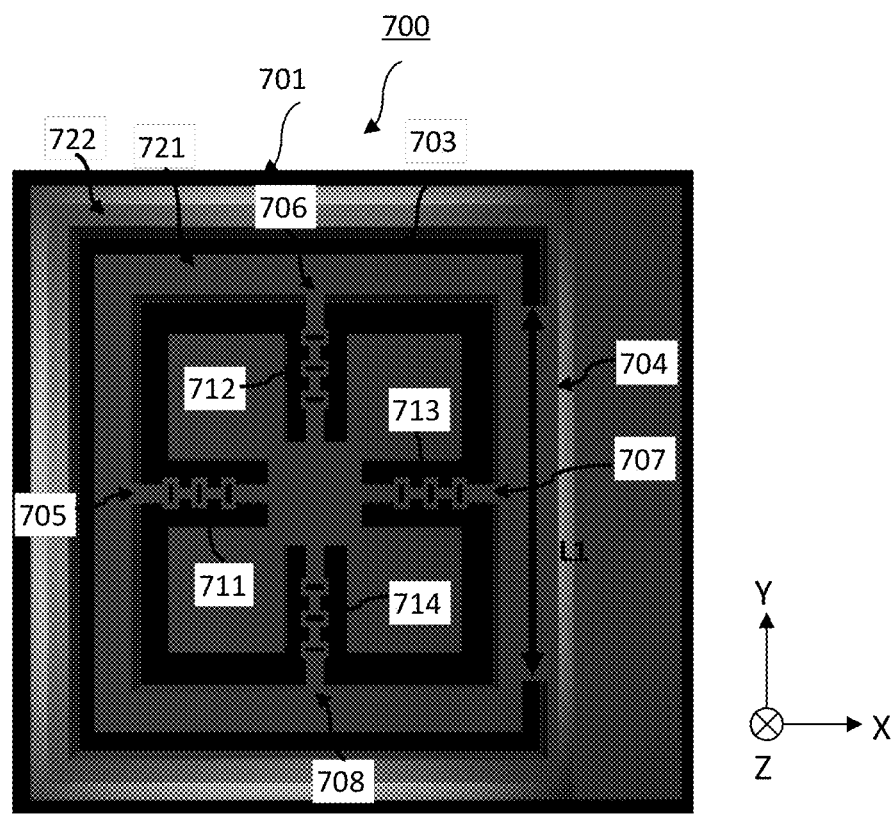
FIG. 18B is a diagram showing a structure of an acceleration sensor related to example 3 and a planar view diagram showing an approximate structure of type D1.

FIG. 18B is a planar view diagram of an approximate structure of an acceleration sensor 700 seen from the upper surface. The acceleration sensor 700 in FIG. 18B is arranged with stress relief parts 711~714 on flexible parts 705~708 formed on a semiconductor substrate 701 and further arranged with a slit 703 and a linking part 704. The structure of the acceleration sensor 700 shown in FIG. 18B is called [type D1]. The slit 703 passes through the semiconductor substrate 701 in a Z axis direction in the diagram and is arranged to enclose three edges of the periphery of the flexible parts 705~708. The semiconductor substrate 701 is divided by the slit 703 into an interior frame 721 which includes the flexible parts 705~708 and an exterior frame 722 which is positioned on the periphery of the interior frame 721. The interior frame 721 and the exterior frame 722 are linked by the linking part 704. The length of the linking part 704 is L1 (660 [μm]). Furthermore, the structure of the stress relief parts 611~614 shown in FIG. 18A is the same as the structure of the stress relief parts 711~714 shown in FIG. 18B. The structure of the stress relief parts 711~714 shown in FIG. 18B is a donut type shape with different sizes. The structure of the stress relief parts 611~614 shown in FIG. 18A is the same as the structure of the stress relief parts 411~414 and the stress relief parts 511~514 shown in FIG. 17A and FIG. 17B. The size of the donut shape of the stress relief parts 711~714 is smaller than the size of the donut shape of the stress relief parts 611~614.

Figure 19A:
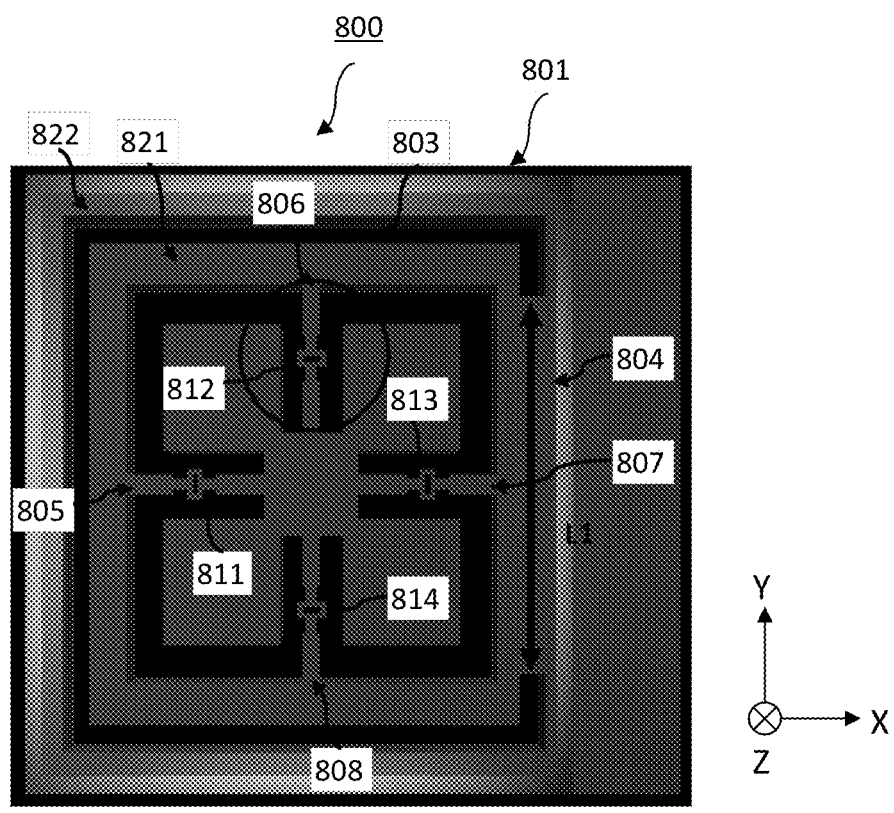
FIG. 19A is a diagram showing a structure of an acceleration sensor related to example 3 and a planar view diagram showing an approximate structure of type E1.

FIG. 19A is a planar view diagram of an approximate structure of an acceleration sensor 800 seen from the upper surface. The acceleration sensor 800 in FIG. 19A is arranged with stress relief parts 811~814 on flexible parts 805~808 formed on a semiconductor substrate 801 and further arranged with a slit 803 and a linking part 804. The structure of the acceleration sensor 800 shown in FIG. 19A is called [type E1]. The shape of the slit 803 and the linking part 804 are the same as the slit 603 and 703 and the linking part 604 and 704 shown in FIG. 18A and FIG. 18B. The semiconductor substrate 801 is divided by the slit 803 into an interior frame 821 which includes the flexible parts 805~808 and an exterior frame 822 which is positioned on the periphery of the interior frame 821. In addition, the stress relief parts 811~814 are formed having one with the same donut shape as the stress relief parts 711~714 shown in FIG. 18B.

Figure 19B:
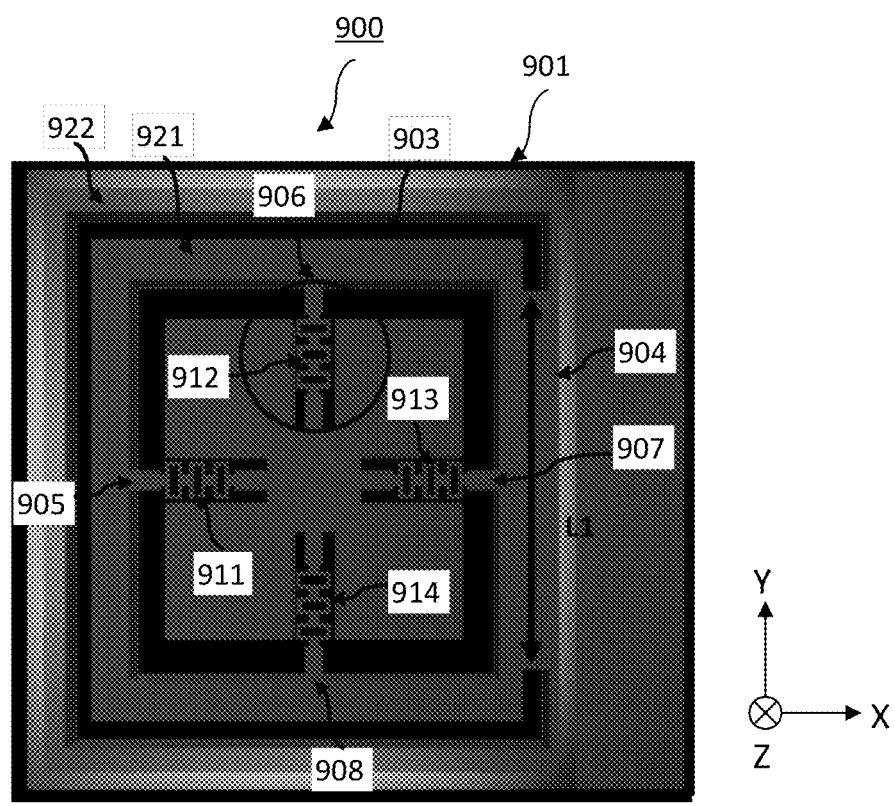
FIG. 19B is a diagram showing a structure of an acceleration sensor related to example 3 and a planar view diagram showing an approximate structure of type F1.

FIG. 19B is a planar view diagram of an approximate structure of an acceleration sensor 900 seen from the upper surface. The acceleration sensor 900 in FIG. 19B is arranged with stress relief parts 911~914 on flexible parts 905~908 formed on a semiconductor substrate 901 and further arranged with a slit 903 and a linking part 904. The structure of the acceleration sensor 900 shown in FIG. 19B is called [type F1]. The shape of the slit 903 and the linking part 904 are the same as the slit 603 and 703 and the linking part 604 and 704 shown in FIG. 18A and FIG. 18B. The semiconductor substrate 901 is divided by the slit 903 into an interior frame 921 which includes the flexible parts 905~908 and an exterior frame 922 which is positioned on the periphery of the interior frame 921. In addition, size of the donut shape of the stress relief parts 911~914 is smaller than the donut shape of the stress relief parts 411~414 and stress relief parts 511~514 shown in FIGS. 17A and 17B and larger than the donut shape of the stress relief parts 811~814 shown in FIG. 19A.

Figure 20A:
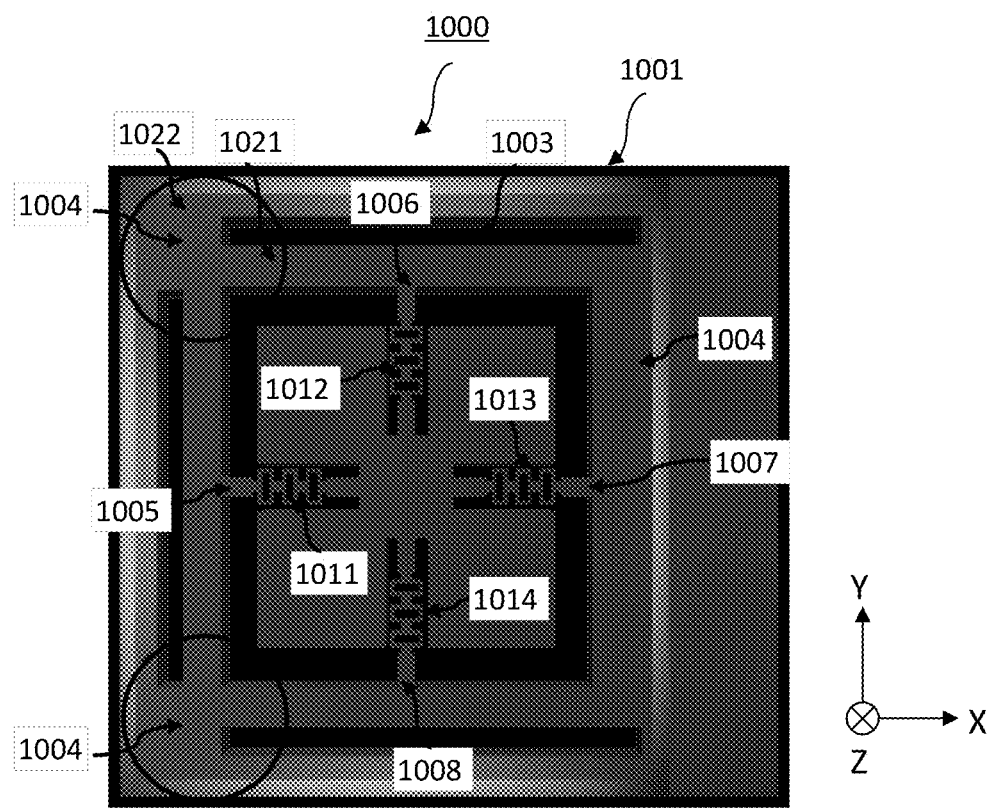
FIG. 20A is a diagram showing a structure of an acceleration sensor related to example 3 and a planar view diagram showing an approximate structure of type G1.

FIG. 20A is a planar view diagram of an approximate structure of an acceleration sensor 1000 seen from the upper surface. The acceleration sensor 1000 in FIG. 20A is arranged with stress relief parts 1011~1014 on flexible parts 1005~1008 formed on a semiconductor substrate 1001 and further arranged with a slit 1003. The structure of the acceleration sensor 1000 shown in FIG. 20A is called [type G1]. The slit 1003 passes through the semiconductor substrate 1001 in a Z axis direction in the diagram, is divided (circle section shown in the diagram) to enclose three edges of the periphery of the flexible parts 1005~1008 as a plurality of line shape slits. This divided section and the right side section adjacent to the flexible part 1007 becomes a linking part 1004 which links an interior frame 1021 and an exterior frame 1022 at three places. The shape of the stress relief parts 1011~1014 is the same as the stress relief parts 911~914 shown in FIG. 19B.

Figure 20B:
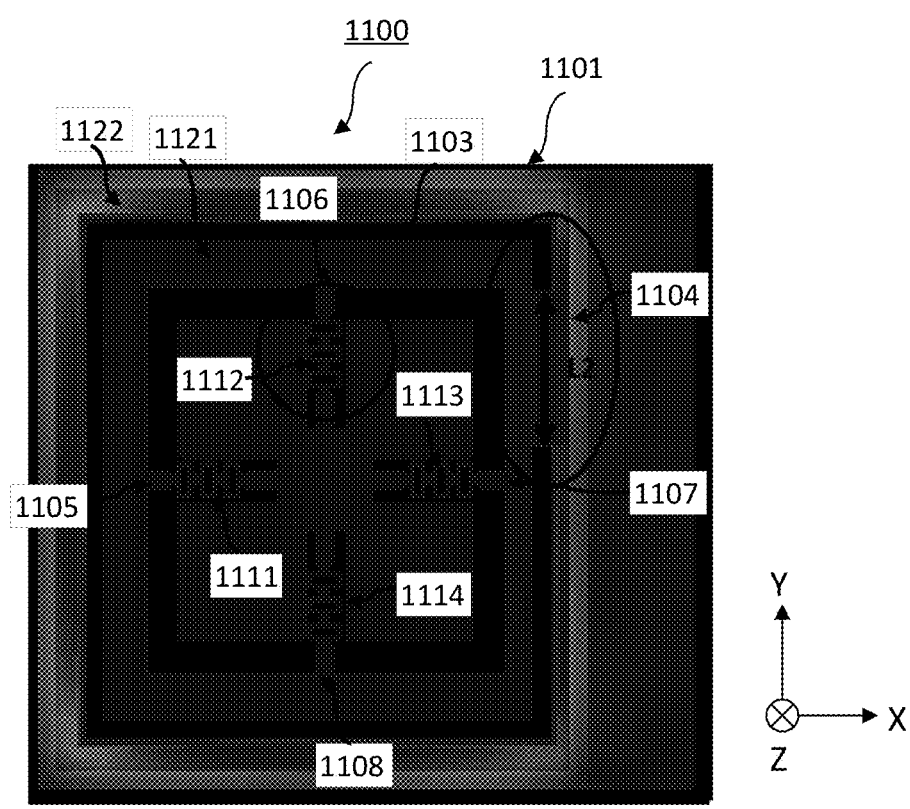
FIG. 20B is a diagram showing a structure of an acceleration sensor related to example 3 and a planar view diagram showing an approximate structure of type H1.

FIG. 20B is a planar view diagram of an approximate structure of an acceleration sensor 1100 seen from the upper surface. The acceleration sensor 1100 in FIG. 20B is arranged with stress relief parts 1111~1114 on flexible parts 1105~1108 formed on a semiconductor substrate 1101 and further arranged with a slit 1103. The structure of the acceleration sensor 1100 shown in FIG. 20B is called [type H1]. The slit 1103 passes through the semiconductor substrate 1101 in a Z axis direction in the diagram and is arranged to enclose three edges of the periphery of the flexible parts 1105~1108. The semiconductor substrate 1101 is divided by the slit 1103 into an interior frame 1121 which includes the flexible parts 1105~1108 and an exterior frame 1122 which is positioned on the periphery of the interior frame 1121. The interior frame 1121 and the exterior frame 1122 are linked by a linking part 1104. The length of the linking part 1104 is L2 (270 [μm]). The linking part 1104 is arranged further to the top than a center part which faces the sensor 1102. The shape of the stress relief parts 1111~1114 is the same as the stress relief parts 911~914 shown in FIG. 19B.

Figure 21A:
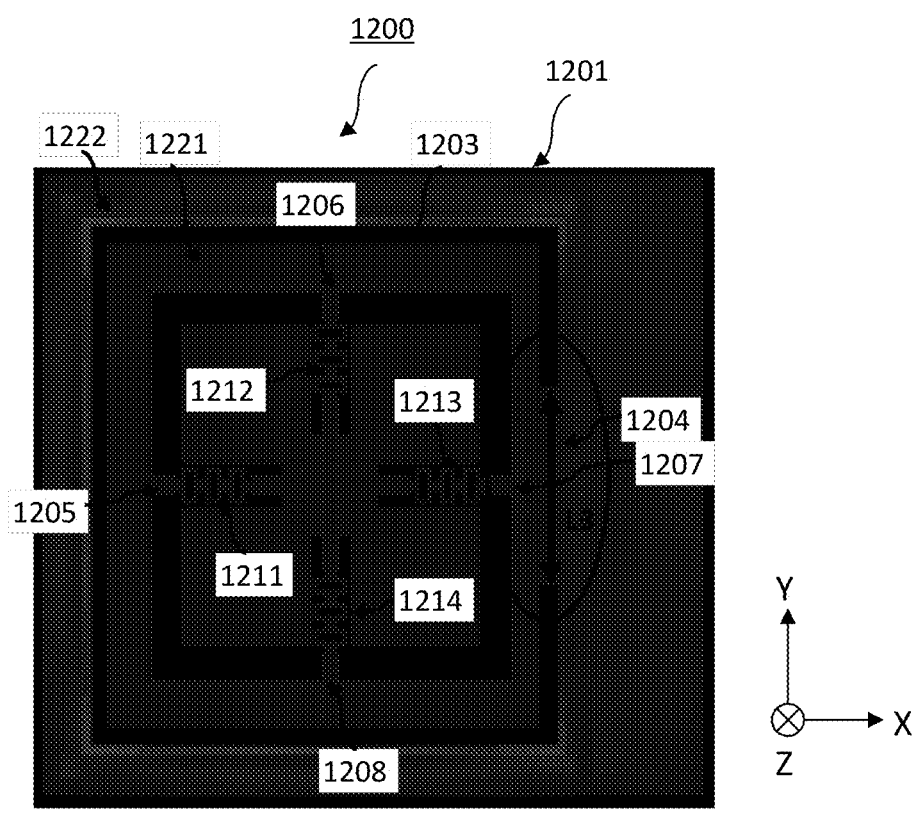
FIG. 21A is a diagram showing a structure of an acceleration sensor related to example 3 and a planar view diagram showing an approximate structure of type I1.

FIG. 21A is a planar view diagram of an approximate structure of an acceleration sensor 1200 seen from the upper surface. The acceleration sensor 1200 in FIG. 21A is arranged with stress relief parts 1211~1214 on flexible parts 1205~1208 formed on a semiconductor substrate 1201 and further arranged with a slit 1203 and a linking part 1204. The structure of the acceleration sensor 1200 shown in FIG. 21A is called [type I1]. The slit 1203 passes through the semiconductor substrate 1201 in a Z axis direction in the diagram and is arranged to enclose four edges of the periphery of the flexible parts 1205~1208. The semiconductor substrate 1201 is divided by the slit 1203 into an interior frame 1221 which includes the flexible parts 1205~1208 and an exterior frame 1222 which is positioned on the periphery of the interior frame 1221. The interior frame 1221 and the exterior frame 1222 are linked by a linking part 1204. The length of the linking part 1204 is L3 (340 [μm]). The length L3 of the linking part 1204 is shorter than the length L1 of the linking part described above and is longer than the length L2 of the linking part described above. The shape of the stress relief parts 1211~1214 is the same the stress relief parts 911~914 shown in FIG. 19B.

Figure 21B:
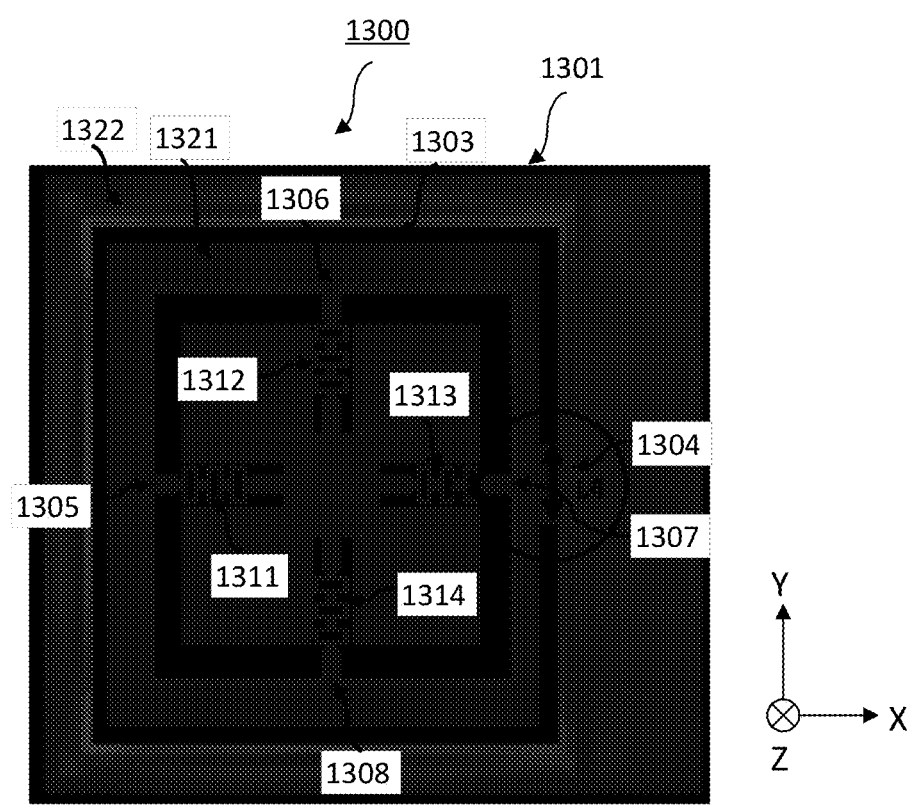
FIG. 21B is a diagram showing a structure of an acceleration sensor related to example 3 and a planar view diagram showing an approximate structure of type J1.

FIG. 21B is a planar view diagram of an approximate structure of an acceleration sensor 1300 seen from the upper surface. The acceleration sensor 1300 in FIG. 21B is arranged with stress relief parts 1311~1314 on flexible parts 1305~1308 formed on a semiconductor substrate 1301 and further arranged with a slit 1303 and a linking part 1304. The structure of the acceleration sensor 1300 shown in FIG. 21B is called [type J1]. The slit 1303 passes through the semiconductor substrate 1301 in a Z axis direction in the diagram and is arranged to enclose four edges of the periphery of the flexible parts 1305~1308. The semiconductor substrate 1301 is divided by the slit 1303 into an interior frame 1321 which includes the flexible parts 1305~1308 and an exterior frame 1322 which is positioned on the periphery of the interior frame 1321. The interior frame 1321 and the exterior frame 1322 are linked by a linking part 1304. The length of the linking part 1304 is L4 (140 [μm]). The length L4 of the linking part 1404 is shorter than the length L1~L3 of the linking parts described above. The shape of the stress relief parts 1311~1314 is the same the stress relief parts 911~914 shown in FIG. 19B.

(Measurement of Stress According to Condition A)

Next, the results of measuring the size of stress received by a flexible part of each type of structure type A1, B1, C1, D1, E1, F1, G1, H1 I1 and J1 in the acceleration sensors 400, 500, 600, 700, 800, 900, 1000, 1100, 1200 and 1300 shown in FIG. 17 to FIG. 21 when stress is applied according to condition A are explained while referring to FIG. 24~FIG. 24.

Figure 22A:
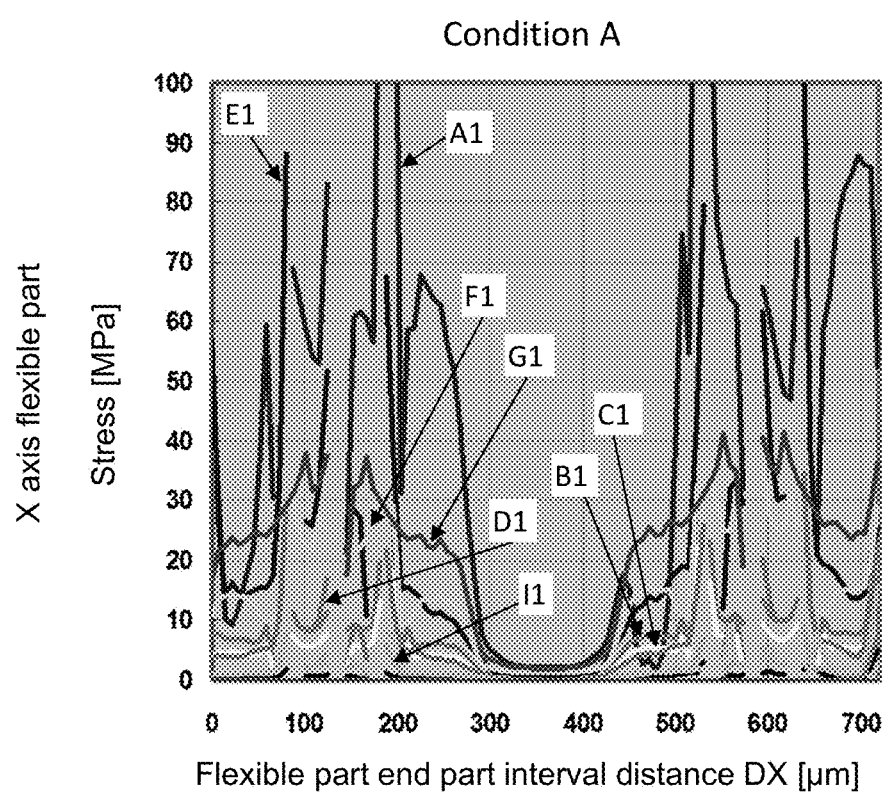
FIG. 22A is a graph showing the results of measuring the size of stress received by a flexible part in an X axis direction of a sensor when stress is applied under condition A to each structure of type A1~J1 related to example 3.

FIG. 22A and FIG. 22B are graphs which show the results of measuring the size of the stress generated in each flexible part of the acceleration sensors 400~1300 when stress is applied under condition A in each of the type A1~J1 structures when a flexible part end part interval distance DX and DY which show the position of a flexible part in an X axis direction and Y axis direction are given as parameters. The flexible part end part interval distance DX is the distance between end parts of the flexible parts 405 and 407 facing the X axis direction, which are connected to the fixing part 402 in the acceleration sensor 400 shown in FIG. 17A. The flexible part end part interval distance DY is the distance between end parts of the flexible parts 406 and 408 facing the Y axis direction which are connected to the fixing part 402 in the acceleration sensor 400 shown in FIG. 17A. Furthermore, the flexible part end part interval distance DX and DY are the same in the acceleration sensors 500~1300 shown in FIG. 17B and FIG. 18~FIG. 21. FIG. 22A is a graph which plots the distribution of stress generated at each predetermined position at a flexible part end part interval distance DX of the flexible parts in an X axis direction when the horizontal axis is given as the flexible part end part interval distance DX range 0 [μm]~700 [μm] and the vertical axis is given as a stress range 0 [MPa]~70 [MPa]. FIG. 22B is a graph which plots the distribution of stress generated at each predetermined position at a flexible part end part interval distance DY of the flexible parts in a Y axis direction when the horizontal axis is given as the flexible part end part interval distance DY range 0 [μm]~700 [μm] and the vertical axis is given as a stress range 0 [MPa]~70 [MPa]. Furthermore, in FIG. 22A and FIG. 22B, the flexible part end part interval distance DX and DY show that the end part interval distance of flexible parts facing in an X axis direction and a Y axis direction is 700 [μm] among the flexible parts 405~408, 505~508, 605~608, 705~708, 805~808, 905~908, 1005~1008, 1105~1108, 1205~1208 and 1305~1308 shown in FIG. 17~FIG. 21.

Figure 23A:
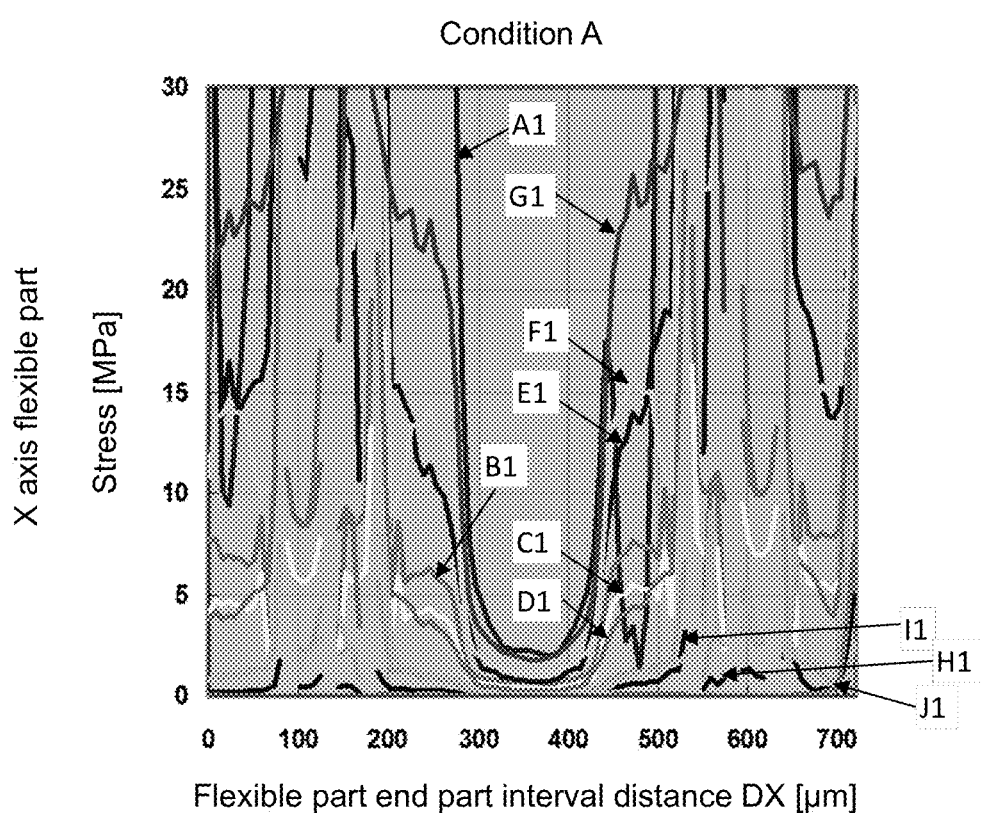
FIG. 23A is a graph showing an expanded view of a 0 [MPa]~30 [MPa] section from the range of stresses in the graph in FIG. 22A related to example 3.
Figure 23B:
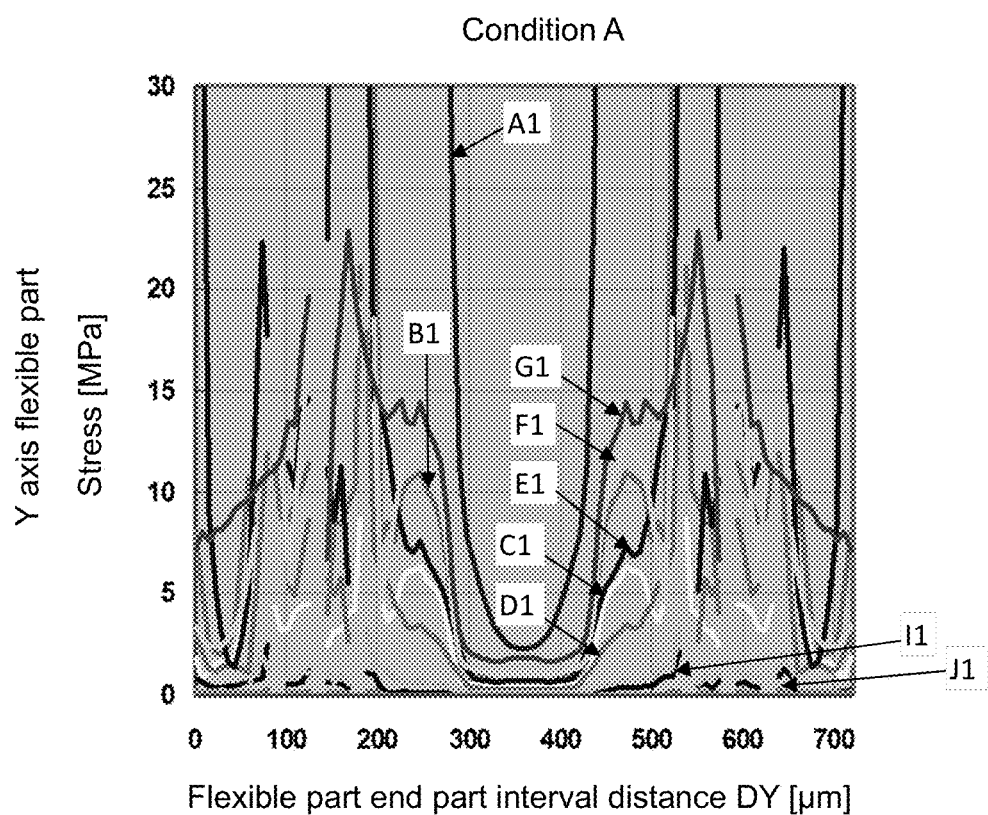
FIG. 23B is a graph showing an expanded view of a 0 [MPa]~30 [MPa] section from the range of stresses in the graph in FIG. 22B related to example 3.
Figure 24A:
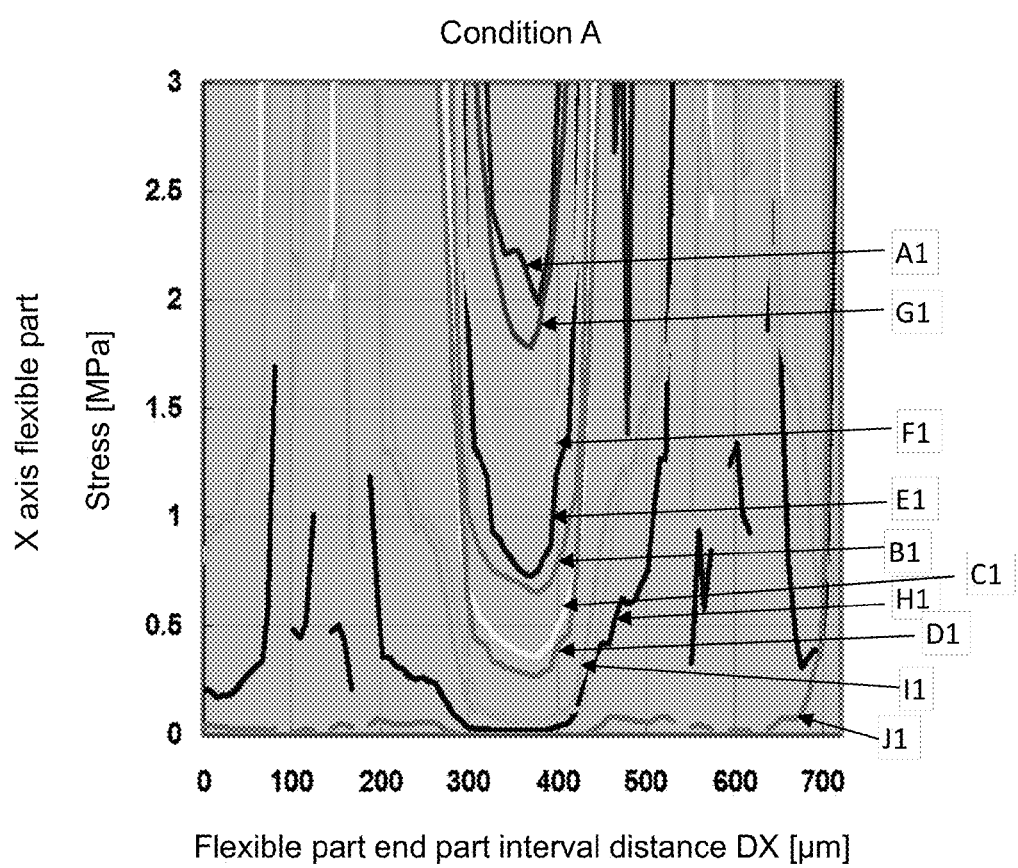
FIG. 24A is a graph showing an expanded view of a 0 [MPa]~3 [MPa] section from the range of stresses in the graph in FIG. 22A related to example 3.
Figure 24B:
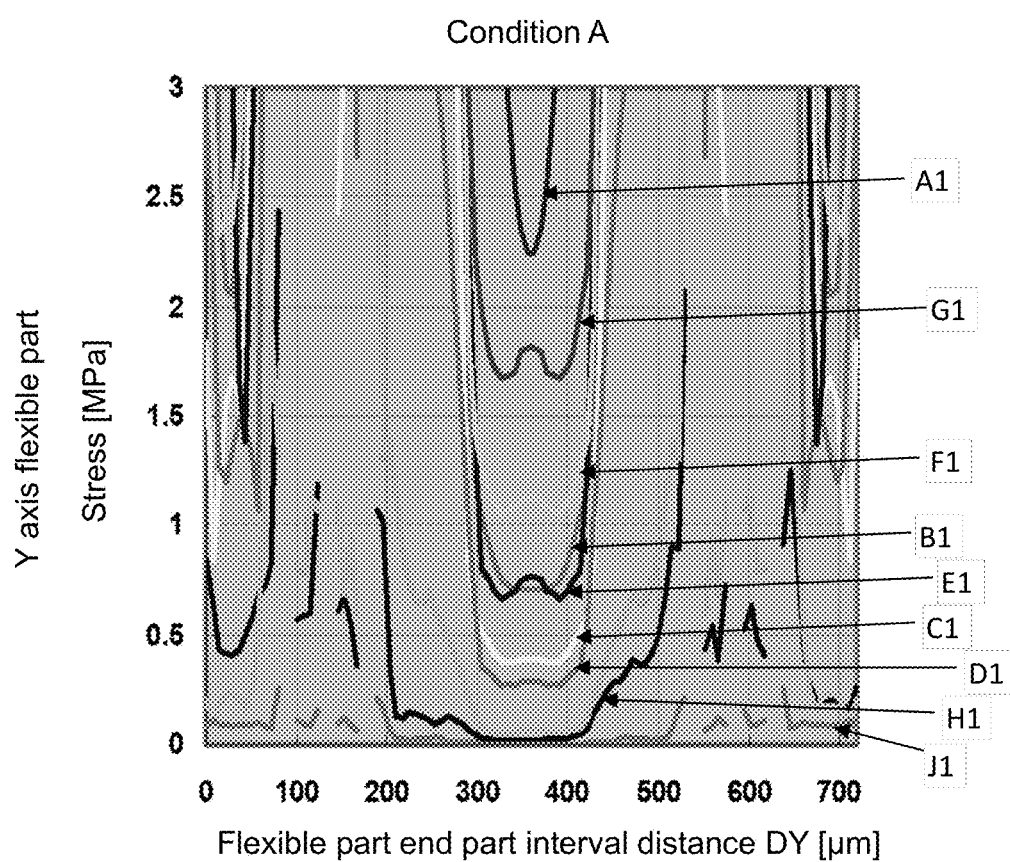
FIG. 24B is a graph showing an expanded view of a 0 [MPa]~3 [MPa] section from the range of stresses in the graph in FIG. 22B related to example 3.

FIG. 23A and FIG. 23B are graphs which show an expanded view of the section 0 {MPa}~30 {MPa} from the range of stresses in each graph in FIG. 22A and FIG. 22B. Furthermore, in FIG. 23A and FIG. 23B, the flexible part end part interval distance DX and DY show that the end part interval distance of flexible parts facing in an X axis direction and a Y axis direction is 700 [μm] among the flexible parts 405~408, 505~508, 605~608, 705~708, 805~808, 905~908, 1005~1008, 1105~1108, 1205~1208 and 1305~1308 shown in FIG. 17~FIG. 21. FIG. 24A and FIG. 24B are graphs which show an expanded view of the section 0 {MPa}~3 {MPa} from the range of stresses in each graph in FIG. 22A and FIG. 22B. Furthermore, in FIG. 24A and FIG. 24B, the flexible part end part interval distance DX and DY show that the end part interval distance of flexible parts facing in an X axis direction and a Y axis direction is 700 [μm] among the flexible parts 405~408, 505~508, 605~608, 705~708, 805~808, 905~908, 1005~1008, 1105~1108, 1205~1208 and 1305~1308 shown in FIG. 17~FIG. 21.

In FIG. 22A and FIG. 22B and FIG. 24A and FIG. 24B, it was found that the order in which a change in stress received by a flexible part in an X axis direction and Y axis direction when stress is applied under condition A was largest is as follows:

type A1>type G1>type E1(type F1)>type B1>type C1>(type D1)>type I1>type H1>type J1>

The size of the stress received by each flexible part in type E1 and type F1 in which the shape of the flexible parts 803 and 903 was a C shape and the length of the linking parts 803 and 903 are L1 (660 [μm]) in addition to the stress relief parts 811~814 and 911~914 was smaller compared to the size of the stress received by a flexible part in type G1 in which the stress relief parts 1011~1014 are combined with a divided slit 1003. From this result, it was found that a single linking shaped slit is more effective in reducing stress on a flexible part than arranging a plurality of divided slits. In addition, in type E1 and type F1, no large difference was observed on the stress reduction effects on a flexible part due to a difference in the shape of the stress relief parts.

It was found that the size of the stress received by a flexible part in type B1 was smaller compared to the size of the stress received by each flexible part in type E1 and type F1. According to this result, it was found that the fact that size of the donut shape of the stress relief parts 511~514 in type B1 is large than the size of the donut shape of the stress relief parts 811~814 and 911~914 in type E1 and type F1 has an effect. That is, it was found that the size of the stress received by a flexible part becomes smaller due to a difference in the shape of a stress relief part rather than a difference in the shape of the slit 803 and 903 in type E1 and F1 and the slit 503 in type B1.

Furthermore, it was found that the size of the stress received by a flexible part in type C1 and type D1 was smaller compared to the size of the stress received by each flexible part in type B1. According to this result, it was found that the size of the stress received by a flexible part becomes even smaller due a difference in the shape of the slit 503 in type B1 and the slit 603 and slit 703 in type C1 and D1 and by arranging a linking part 604 and 704 with a length L1 (660 [μm]). In addition, no large difference was observed in the difference in stress reduction effects due to a difference in the donut shape of the stress relief parts 611~614 in type C1 and the donut shape of the stress parts 711~714 in type D1.

Furthermore, it was found that the size of the stress received by a flexible part in type I1 becomes smaller compared to the size of the stress received by a flexible part in type C1 and type D1. According to this result, it was found that the size of the stress received by a flexible part becomes even smaller due a difference in the shape of the slit 603 and slit 703 in type C1 and type D1 and the slit 1203 in type I1 and by arranging a linking part 1204 with a length L3 (340 [μm]). In this case, no large difference was observed in the difference in stress reduction effects due to a difference in the donut shape of the stress relief parts 611~614 and 711~714 in type C1 and type D1 and the donut shape of the stress parts 1211~1214 in type I1.

Furthermore, it was found that the size of the stress received by a flexible part in type H1 becomes smaller compared to the size of the stress received by a flexible part in type I1. According to this result, it was found that the size of the stress received by a flexible part becomes even smaller due a difference in the shape of the slit 1203 in type I1 and slit 1103 in type H1 and by arranging a linking part 1204 with a shorter length L2 (270 [μm]). In this case, no large difference was observed in the difference in stress reduction effects since the donut shape of the stress relief parts 1211~1214 in type I1 and the donut shape of the stress parts 1111~1114 in type I1 is the same.

Furthermore, it was found that the size of the stress received by a flexible part in type J1 becomes smaller compared to the size of the stress received by a flexible part in type H1. According to this result, it was found that the size of the stress received by a flexible part becomes even smaller due a difference in the shape of the slit 1103 in type H1 and slit 1303 in type J1 and by arranging a linking part 1304 with a shorter length L4 (140 [μm]). In this case, no large difference was observed in the difference in stress reduction effects since the donut shape of the stress relief parts 1111~1114 in type HI1 and the donut shape of the stress parts 1311~1314 in type J1 is the same.

From the measurement results of stress on each flexible part in type A1~J1 described above, it was found that the most effective structure for reducing the effects of stress applied during a resin packaging process is pattern J1 in which a slit and linking part are combined and the length L of the linking part is the shortest.

(Measurement of Stress According to Condition B)

Next, the results of measuring the size of stress received by a flexible part of each type of structure type A1, B1, C1, D1, E1, F1 and G1, in the acceleration sensors 400, 500, 600, 700, 800, 900 and 1000 shown in FIG. 17 to FIG. 20A when stress is applied according to condition B are explained while referring to FIG. 25.

Figure 25A:
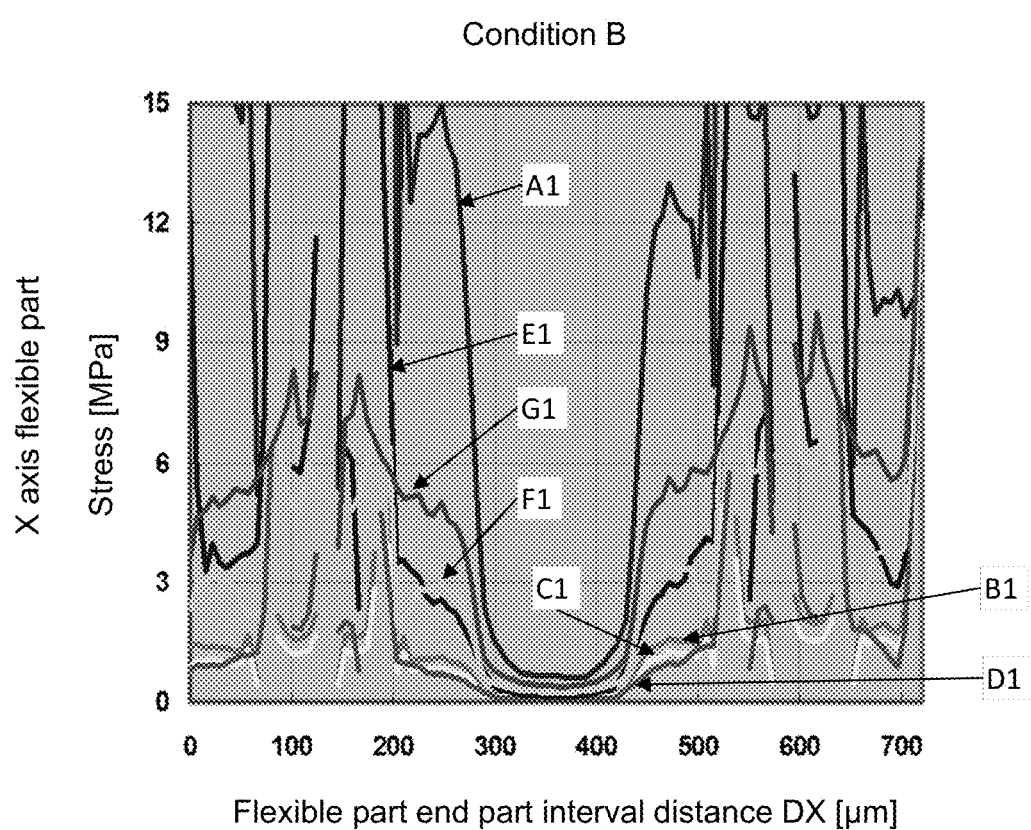
FIG. 25A is a graph showing the results of measuring the size of stress received by a flexible part in an X axis direction of a sensor when stress is applied under condition B to each structure of type A1~G1 related to example 3.
Figure 25B:
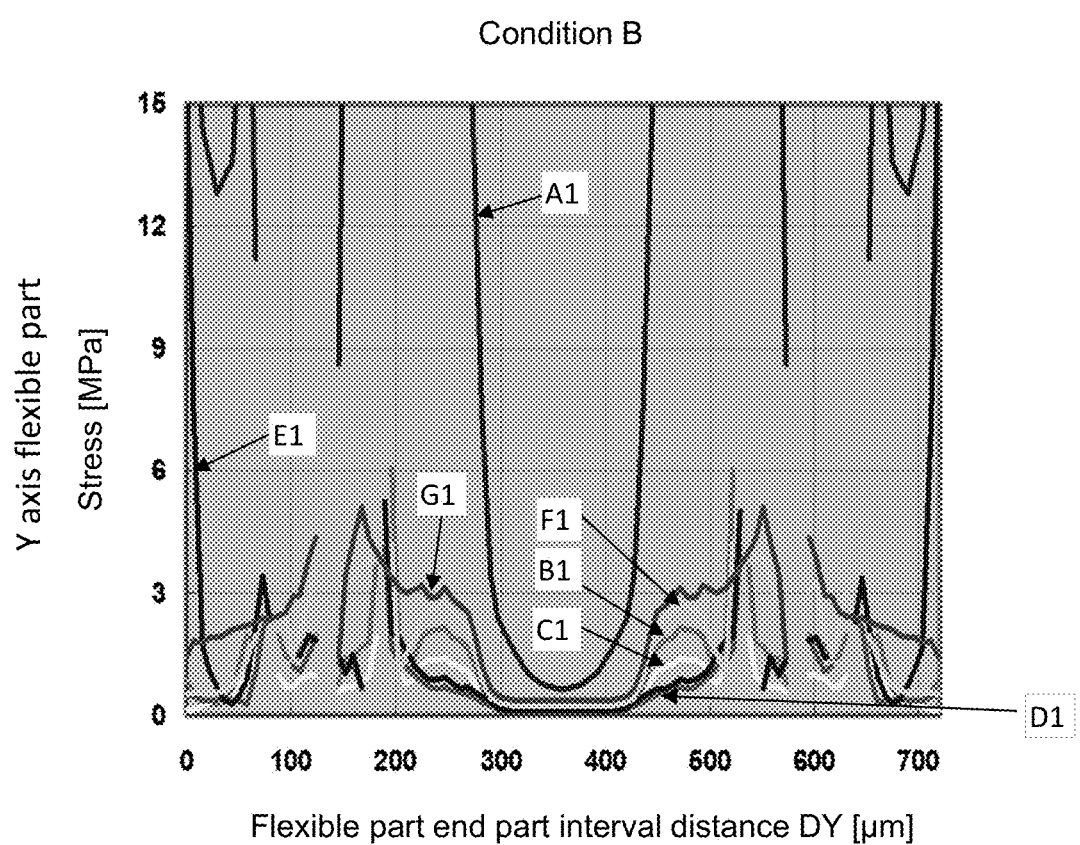
FIG. 25B is a graph showing the results of measuring the size of stress received by a flexible part in a Y axis direction of a sensor when stress is applied under condition B to each structure of type A1~G1 related to example 3.

FIG. 25A and FIG. 25B are graphs which show the results of measuring the size of the stress generated in each flexible part of the acceleration sensors 400~1000 when stress is applied under condition B in each of the type A1~G1 structures when a flexible part end part interval distance DX and DY which show the position of a flexible part in an X axis direction and Y axis direction are given as parameters. FIG. 25A is a graph which plots the results of measuring stress generated in a flexible part in an X axis direction when the horizontal axis is given as the flexible part end part interval distance DX range 0 [μm]~700 [μm] and the vertical axis is given as a stress range 0 [MPa]~15 [MPa]. FIG. 25B is a graph which plots the results of measuring stress generated in the flexible parts in a Y axis direction when the horizontal axis is given as the flexible part end part interval distance DY range 0 [μm]~700 [μm] and the vertical axis is given as a stress range 0 [MPa]~15 [MPa]. Furthermore, in FIG. 25A and FIG. 25B, the flexible part end part interval distance DX and DY show that the end part interval distance of facing flexible parts is 700 [μm] among the flexible parts 405~408, 505~508, 605~608, 705~708, 805~808, 905~908 and 1005~1008 shown in FIG. 17~FIG. 20A.

In FIG. 25A, it was found that the order in which a change in stress received by a flexible part in an X axis direction when stress is applied under condition B was largest is as follows:

type *A*1>type *G*1>type *E*1(type *F*1)>type *B*1>type *C*1>(type *D*1)

This result is the same result as the order found using the stress measurement results shown in FIG. 22~FIG. 24. The main point of difference between each structure in type G1, E1, F1, B1 and type C1, D1 is that the size of stress received by a flexible part in a Z direction becomes smaller due to a difference in the shape of the slits 603 and 703 and by arranging linking parts 604 and 704 with a length L1 (660 [μm]). In this case, there was no large difference in the effects of reducing stress in a Z direction due to a difference in the structure of stress relief parts than a difference in the effects of reducing stress in a Z direction due to a difference in the shape of a slit.

In FIG. 25B, it was found that the order in which a change in stress received by a flexible part in a Y axis direction when stress is applied under condition B was largest is as follows:

type *A*1>type *G*1>type *F*1>type *E*1>type *B*1>type *C*1>(type *D*1)

This result is the same result as the order found using the stress measurement results shown in FIG. 22~FIG. 24. It was found that the effects of stress received by a flexible part from a Z direction become smaller in types B1, C1, D1, E1 and F1 in which the slits 503, 603, 703, 803 and 903 having a linked shape compared to the type G1 in which the slit 1003 is divided. Furthermore, it was found that the effects of stress received by a flexible part from a Z direction become even smaller when the donut shape of stress relief parts 511~514 is increased compared to type E1 and F1. Furthermore, it was found that the effects of stress on a flexible part from a Z direction become even smaller in type C1 and type D1 in which linking parts 604 and 704 with a length L1 (660 [μm]) are arranged compared to type B1 in which the slit 503 is arranged on only three edges of the periphery of the sensor 500. However there was no large difference in the effects of reducing stress in a Z direction due to a difference in the donut shape of the stress relief parts 611~614 in type C1 and the stress relief parts 711~714 in type D1.

(Measurement of Stress Due to a Combination of a Slit and Stress Relief Parts)

Next, the results of measuring stress received by a flexible part when stress is applied under condition A and condition B in the case where neither a slit and stress relief part are not arranged, where only a slit is arranged, where only a stress relief part is arranged and where both a slit and stress relief part are arranged in an acceleration sensor is explained while referring to FIG. 26 and FIG. 27.

Figure 26A:
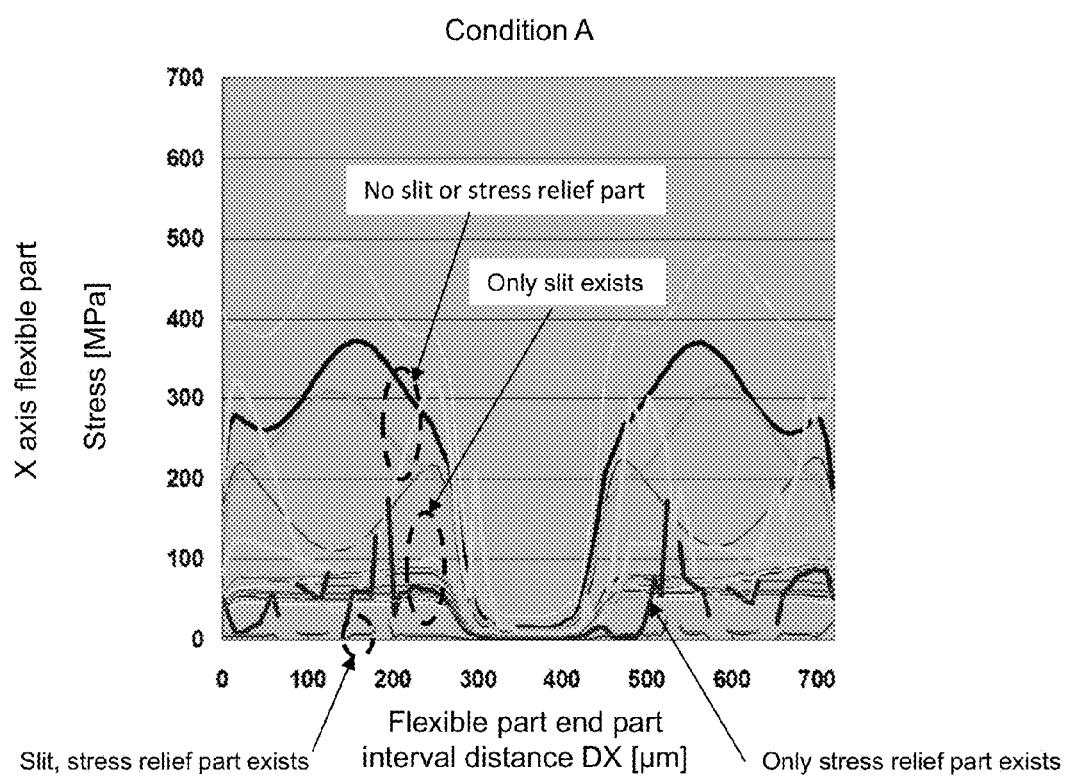
FIG. 26A is a graph showing the results of measuring stress received by a flexible part in an X axis direction in each acceleration sensor in the case where stress is applied under condition A in the case where neither a slit and stress relief part are arranged, where only a slit is arranged, where only a stress relief part is arranged and where both a slit and stress relief part are arranged related to example 3.
Figure 26B:
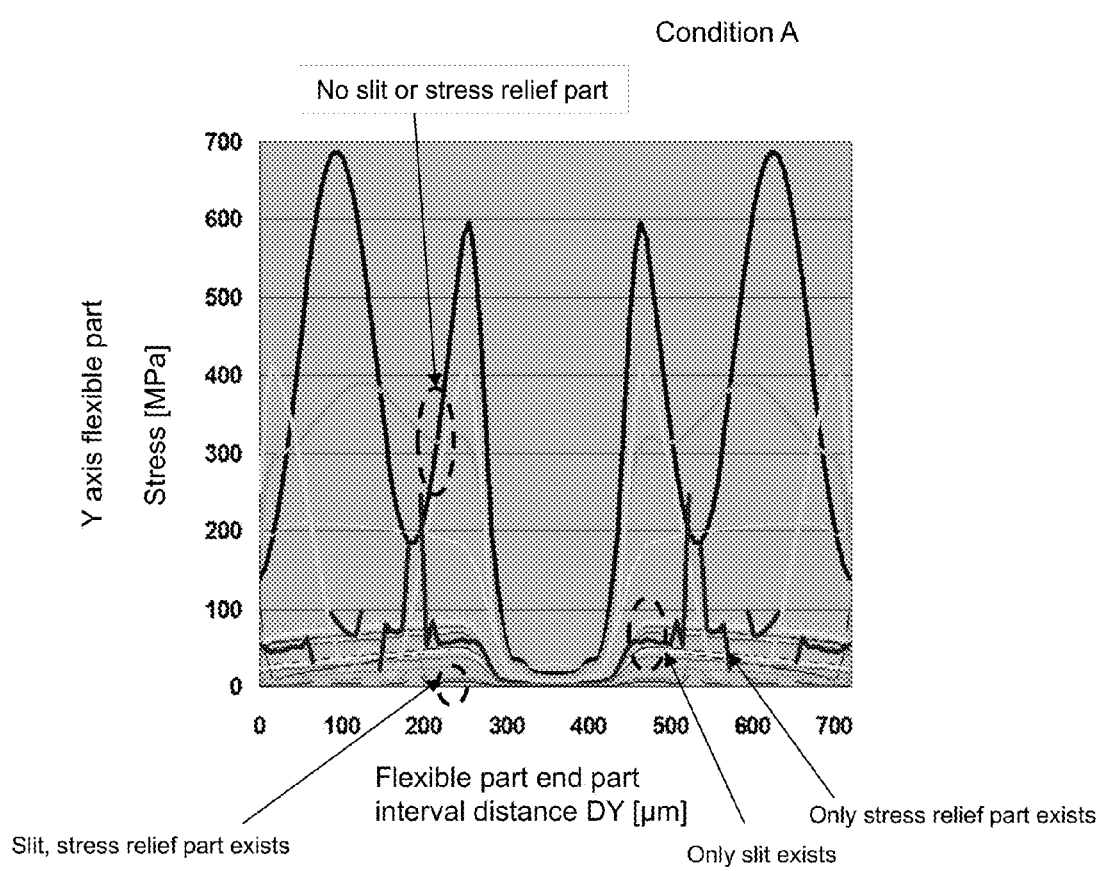
FIG. 26B is a graph showing the results of measuring stress received by a flexible part in a Y axis direction in each acceleration sensor in the case where stress is applied under condition A in the case where neither a slit and stress relief part are arranged, where only a slit is arranged, where only a stress relief part is arranged and where both a slit and stress relief part are arranged related to example 3.

FIG. 26A and FIG. 26B are graphs which show the results of measuring stress generated in a flexible part in an X axis direction add Y axis direction in each acceleration sensor in the case where stress is applied under condition A in the case where neither a slit and stress relief part are arranged, where only a slit is arranged, where only a stress relief part is arranged and where both a slit and stress relief part are arranged. FIG. 26A is a graph which plots the results of measuring stress received by a flexible part in an X axis direction when the horizontal axis is given as the flexible part end part interval distance DX range 0 [μm]~700 [μm] and the vertical axis is given as a stress range 0 [MPa]~700 [MPa]. FIG. 26B is a graph which plots the results of measuring stress received by a flexible part in a Y axis direction when the horizontal axis is given as the flexible part end part interval distance DY range 0 [μm]~700 [μm] and the vertical axis is given as a stress range 0 [MPa]~700 [MPa]. Furthermore, in FIG. 26A and FIG. 26B, the flexible part end part interval distance DX and DY show that each end part interval distance of flexible parts facing in an X axis direction and a Y axis direction respectively is 700 [μm]

In the measurement result of stress in an X axis direction shown in FIG. 26A, it was found that the stress received by a flexible part in an X direction of the acceleration sensor which is not arranged with either a slit or stress relief part is largest, and the stress received by a flexible part in an X axis direction of a sensor becomes smaller in the order; arranged with only a stress relief part, arranged with only a slit, and arranged with both a slit and stress relief part.

In the measurement result of stress in an Y axis direction shown in FIG. 26B, it was found that the stress received by a flexible part in a Y direction of the acceleration sensor which is not arranged with either a slit or stress relief part is largest, and the stress received by a flexible part in a Y axis direction of a sensor becomes smaller in the order; arranged with only a stress relief part, arranged with only a slit, and arranged with both a slit and stress relief part.

Figure 27A:
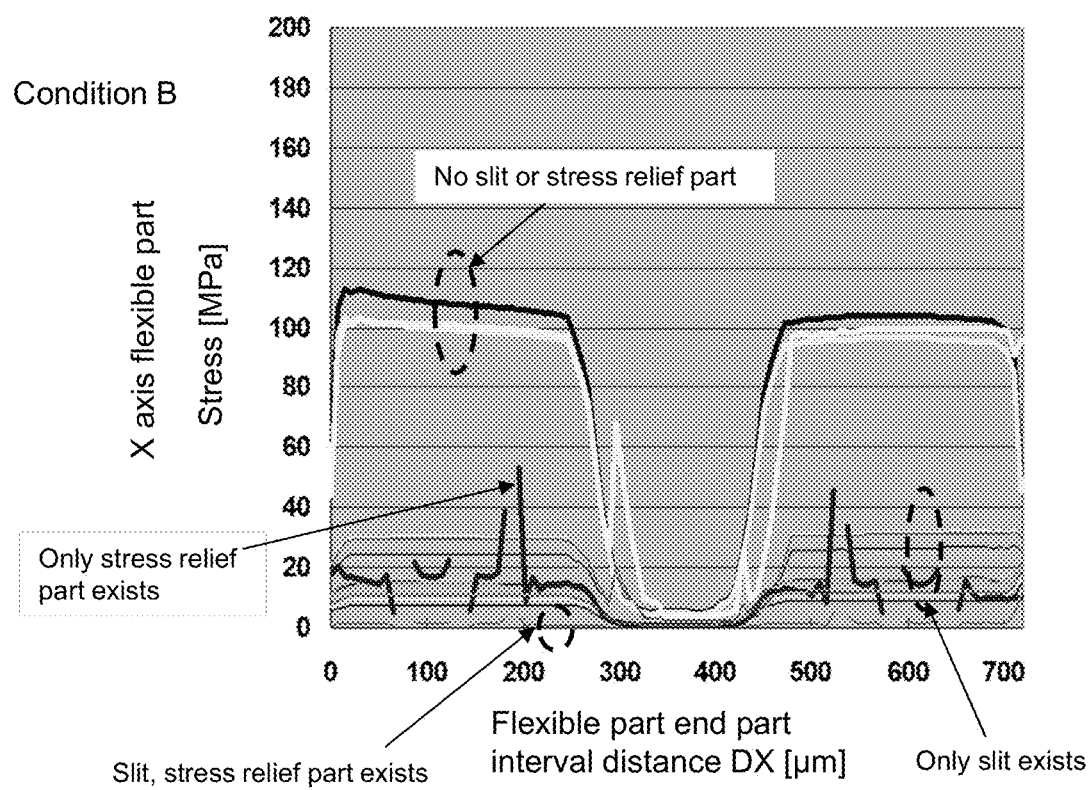
FIG. 27A is a graph showing the results of measuring stress received by a flexible part in an X axis direction in each acceleration sensor in the case where stress is applied under condition B in the case where neither a slit and stress relief part are arranged, where only a slit is arranged, where only a stress relief part is arranged and where both a slit and stress relief part are arranged related to example 3.
Figure 27B:
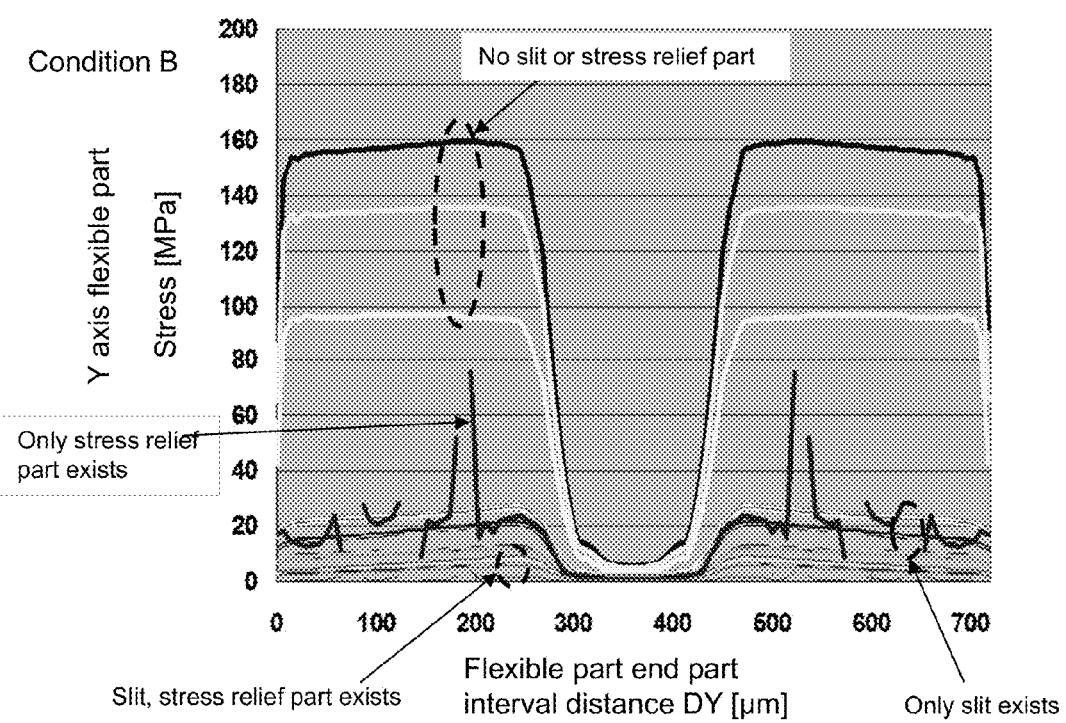
FIG. 27B is a graph showing the results of measuring stress received by a flexible part in an Y axis direction in each acceleration sensor in the case where stress is applied under condition B in the case where neither a slit and stress relief part are arranged, where only a slit is arranged, where only a stress relief part is arranged and where both a slit and stress relief part are arranged related to example 3.

FIG. 27A and FIG. 27B are graphs which show the results of measuring stress generated in a flexible part in an X axis direction add Y axis direction in each acceleration sensor in the case where stress is applied under condition B in the case where neither a slit and stress relief part are arranged, where only a slit is arranged, where only a stress relief part is arranged and where both a slit and stress relief part are arranged. FIG. 27A is a graph which plots the results of measuring stress received by a flexible part in an X axis direction when the horizontal axis is given as the flexible part end part interval distance DX range 0 [μm]~700 [μm] and the vertical axis is given as a stress range 0 [MPa]~200 [MPa]. FIG. 27B is a graph which plots the results of measuring stress received by a flexible part in a Y axis direction when the horizontal axis is given as the flexible part end part interval distance DY range 0 [μm]~700 [μm] and the vertical axis is given as a stress range 0 [MPa]~200 [MPa]. Furthermore, in FIG. 27A and FIG. 27B, the flexible part end part interval distance DX and DY show that each end part interval distance of flexible parts facing in an X axis direction and a Y axis direction respectively is 700 [μm]

In the measurement result of stress in an X axis direction shown in FIG. 27A, it was found that the stress received by a flexible part in an X direction of the acceleration sensor which is not arranged with either a slit or stress relief part is largest, and the stress received by a flexible part in an X axis direction of a sensor becomes smaller in the order; arranged with only a stress relief part, arranged with only a slit, and arranged with both a slit and stress relief part.

In the measurement result of stress in an Y axis direction shown in FIG. 27B, it was found that the stress received by a flexible part in a Y direction of the acceleration sensor which is not arranged with either a slit or stress relief part is largest, and the stress received by a flexible part in a Y axis direction of a sensor becomes smaller in the order; arranged with only a stress relief part, arranged with only a slit, and arranged with both a slit and stress relief part.

As described above, by arranging a slit which divides an interior frame and an exterior frame on a semiconductor substrate and a linking part which links the interior frame and the exterior frame in an acceleration sensor, it is possible to reduce the stress received by the sensor during a resin packaging process and provide a dynamic quantity sensor which reduces variation in sensor characteristics due to stress. Furthermore, by arranging a stress relief part on a flexible part it is possible to further reduce stress received by the sensor during a resin packaging process. In addition, by forming a continuous slit so that at least three edges of the periphery of the interior frame are enclosed, reducing the length L of a linking part to be shorter than the length of the slit and linking a part of the interior frame and exterior frame using the linking part at one section, it is possible to further reduce stress received by a sensor due to resin packaging. Furthermore, in the acceleration sensor 300 shown in the third embodiment, it is possible to reduce the effects of stress applied during a resin packing process reaching the substrate 160.

Furthermore, although an example whereby the dynamic quantity sensor related to the present invention applied to an acceleration sensor is shown in the embodiments described above, it is also possible to apply the dynamic quantity sensor to an electrostatic capacitance type or piezoelectric type dynamic quantity sensor, etc. In addition, a displacement detection means of a spindle used in the dynamic quantity sensor related to the present invention may include a stress conversion element which converts stress placed on a flexible part into an electric signal and a piezo resistor or piezoelectric type dynamic quantity sensor can be exemplified. In addition, an electrostatic capacitance type formed with a displacement detection means comprising an electrode (movable electrode) formed on a spindle and an electrode (fixed electrode) arranged at a position facing the movable electrode may be used as a displacement detection means other than a piezo resistor or piezoelectric type, and any displacement detection means may be used in the dynamic quantity sensor related to the present invention.

Although the dynamic quantity sensor related to the present invention is distributed as a single chip, the dynamic quantity sensor related to the present invention may be distributed as an electronic product combining a packaged substrate mounted with an active element such as an IC or a circuit substrate. This electronic product can also be installed in a game device, a mobile terminal device (for example, a mobile phone, notebook type personal computer, PDA) etc and used for various purposes.

What is claimed is:

1. A dynamic quantity sensor comprising:
   a semiconductor substrate including a fixing part and a movable part positioned on an interior side of the fixing part, the fixing part including an interior frame configured to enclose the movable part, an exterior frame positioned on a periphery of the interior frame, a slit configured to divide the interior frame and the exterior frame, and a linking part configured to link the interior frame and the exterior frame; and
   a cap component configured to cover the movable part;
   wherein
   the movable part includes a first flexible part and a second flexible part,
   the first flexible part is connected to the inside of the interior frame at a predetermined position,
   the linking part is connected to the outside of the interior frame at the predetermined position,
   the first flexible part and the linking part are on opposite sides of the predetermined position,
   the first flexible part, the second flexible part and the linking part are positioned on a straight line, and
   a length of the linking part along the interior frame is shorter than a length of the movable part along the interior frame.

2. The dynamic quantity sensor according to claim 1, wherein the slit has a shape including at least one open part configured to divide the interior frame and the exterior frame except the linking part.

3. The dynamic quantity sensor according to claim 1, further comprising:
   a substrate configured to carry the semiconductor substrate;
   wherein
   the semiconductor substrate includes a bump electrically connected to the substrate.

4. The dynamic quantity sensor according to claim 1, wherein the first flexible part and the second flexible part, the interior frame and the exterior frame have a line symmetrical shape.

5. The dynamic quantity sensor according to claim 4, wherein the first flexible part and the second flexible part, the interior frame and the exterior frame have a roughly square shape.

6. The dynamic quantity sensor according to claim 1, wherein a length of the linking part is shorter than a length of the slit.

7. The dynamic quantity sensor according to claim 6, wherein the linking part links one part of the interior frame and one part of the exterior frame at one section.

8. The dynamic quantity sensor according to claim 1, wherein the first flexible part and the second flexible part includes a stress relief part.

9. The dynamic quantity sensor according to claim 8, wherein the stress relief part includes at least one ring shape, and is arranged line symmetrical along a length direction of the first flexible part and the second flexible part.

* * * * *